United States Patent
Gregersen et al.

(10) Patent No.: US 9,112,082 B2
(45) Date of Patent: Aug. 18, 2015

(54) ELECTRICALLY DRIVEN SINGLE PHOTON SOURCE

(75) Inventors: Niels Gregersen, Copenhagen N (DK); Julien Claudon, Gendoble Cedex (FR); Jean-Michel Gérard, Grenoble Cedex (FR)

(73) Assignees: DANMARKS TEKNISKE UNIVERSITET, Lyngby (DK); COMMISSARIAT A L ENERGIE ATOMIQUE, Paris (FR)

(*) Notice: Subject to any disclaimer, the term of this patent is extended or adjusted under 35 U.S.C. 154(b) by 0 days.

(21) Appl. No.: 13/384,411
(22) PCT Filed: Jul. 23, 2010
(86) PCT No.: PCT/DK2010/050196
§ 371 (c)(1),
(2), (4) Date: Mar. 12, 2012
(87) PCT Pub. No.: WO2011/009465
PCT Pub. Date: Jan. 27, 2011

(65) Prior Publication Data
US 2012/0161663 A1 Jun. 28, 2012

Related U.S. Application Data

(60) Provisional application No. 61/227,888, filed on Jul. 23, 2009.

(30) Foreign Application Priority Data

Jul. 23, 2009 (EP) .................................. 09166255

(51) Int. Cl.
*H05B 37/00* (2006.01)
*H01L 33/04* (2010.01)
(Continued)

(52) U.S. Cl.
CPC ................ *H01L 33/06* (2013.01); *B82Y 20/00* (2013.01)

(58) Field of Classification Search
USPC .......... 315/246, 291; 372/50.124; 257/13, 14; 977/762
See application file for complete search history.

(56) References Cited

U.S. PATENT DOCUMENTS 6,577,659 B1 * 6/2003 Razeghi .................... 372/45.01
6,868,103 B2   3/2005 Gerard et al.
(Continued)

FOREIGN PATENT DOCUMENTS

EP      1 990 677 A1   11/2008
FR      2 809 542 A1   11/2001
WO   WO 2006/022563 A2   3/2006

OTHER PUBLICATIONS

Harmand, Jean-Christophe et al., "Potential of semiconductor nanowires for single photon sources" Proc. SPIE, 2009pp. 722219-1-722219-10, vol. 7222.*
(Continued)

*Primary Examiner* — Douglas W Owens
*Assistant Examiner* — Jonathan Cooper
(74) *Attorney, Agent, or Firm* — Knobbe Martens Olson & Bear LLP

(57) ABSTRACT

The present invention relates to a single photon source 1800 comprising a tapered nanowire 1802, where the nanowire 1802 is made of a semiconductor material, a first electrode 1828 and second electrode 1814, where the electrodes are electrically coupled to a photon emitter 1804 embedded in the nanowire 1802 and wherein the photon emitter 1804 is capable of emitting a single photon when an activation voltage is applied between the electrodes. In advantageous embodiments of the invention, the nanowire is encircled by air or vacuum, such that advantage can be taken of the resultant large ratio between a refractive index of the nanowire and the encircling material, air. Another advantageous feature might be that the first and second electrodes are optically transparent, such that they can be used as part of a reflective element or anti-reflective element.

18 Claims, 21 Drawing Sheets

(51) Int. Cl.
B82Y 99/00 (2011.01)
H01L 33/06 (2010.01)
B82Y 20/00 (2011.01)

(56) References Cited

U.S. PATENT DOCUMENTS

| | | | |
|---|---|---|---|
| 2003/0015228 | A1 | 1/2003 | Liu |
| 2003/0152228 | A1* | 8/2003 | Gerard et al. ............... 380/220 |
| 2004/0075464 | A1 | 4/2004 | Samuelson et al. |
| 2005/0161662 | A1* | 7/2005 | Majumdar et al. ............ 257/18 |
| 2006/0097389 | A1 | 5/2006 | Islam et al. |
| 2006/0098705 | A1* | 5/2006 | Wang et al. ............. 372/50.124 |
| 2006/0280414 | A1 | 12/2006 | Beausoleil et al. |
| 2007/0210300 | A1* | 9/2007 | Kawaguchi ..................... 257/14 |
| 2011/0249322 | A1* | 10/2011 | Wang et al. ................... 359/344 |

OTHER PUBLICATIONS

Friedler, I. et al., "Solid-state single photon sources: the nanowire antenna" Optics Express, Feb. 16 2009, pp. 2095-2110, vol. 17, No. 4.*

Bennett, A.J. et al., "High-efficiency single-photon sources based on InAs/GaAs quantum dots in pillar microcavities" Physica E, 2005, pp. 391-394, vol. 26.

Claudon, J. et al., "High Brightness Single Photon Sources Based on Photonic Wires" Transparent Optical Networks, 2009, ICTON 11th International Conference on IEEE, pp. 1-4.

Friedler, I. et al., "Efficient photonic mirrors for semiconductor nanowires" Optics Letters, Nov. 15, 2008, p. 2635-2637, vol. 33, No. 22.

Friedler, I. et al., "Solid-state single photon sources: the nanowire antenna" Optics Express, Feb. 16, 2009, pp. 2095-2110, vol. 17, No. 4.

Gregersen, Niels et al., "Controlling the emission profile of a nanowire with a conical taper" Optics Letters, Aug. 1, 2008, pp. 1693-1695, vol. 33, No. 15.

Harmand, Jean-Christophe et al., "Potential of semiconductor nanowires for single photon sources" Proc. of SPIE, 2009, pp. 722219-1-722219-10, vol. 7222.

Minot, Ethan D. et al., "Single Quantum Dot Nanwire LEDs" Nano Letters, 2007, pp. 367-371, vol. 7, No. 2.

Nowicki-Bringuier, Y.-R. et al., "A novel high-efficiency single-mode single photon source" Ann. Phys. Fr., 2007, pp. 151-154, vol. 32, No. 2-3.

Zhang, J.P. et al., "Photonic-Wire Laser" Physical Review Letters, Oct. 2, 1995, pp. 2678-2681, vol. 75, No. 14.

Zwiller, V. et al., "Optics with single nanowires" C. R. Physique, 2008, pp. 804-815, vol. 9.

* cited by examiner

US 9,112,082 B2

ELECTRICALLY DRIVEN SINGLE PHOTON SOURCE

CROSS REFERENCE TO RELATED APPLICATIONS

This application claims the benefit and priority to and is a U.S. National Phase Application of PCT International Application Number PCT/DK2010/050196, filed on Jul. 23, 2010, designating the United States of America and published in the English language, which is an International Application of and claims the benefit of priority to European Patent Application No. 09166255.1, filed on Jul. 23, 2009, and U.S. Provisional Application No. 61/227,888, filed on Jul. 23, 2009. The disclosures of the above-referenced applications are hereby expressly incorporated by reference in their entireties.

FIELD OF THE INVENTION

The invention relates to a single photon source, and in particular to an electrically driven single photon source.

BACKGROUND OF THE INVENTION

Major efforts have been devoted over the last ten years to the development of light emitters able to emit photons one by one in a deterministic way. Such emitters, known as single photon sources (SPS), are key devices in quantum cryptography, and could find applications in quantum information processing or metrology (standards for the energy or the light flux).

The spontaneous far-field radiation pattern of a single photon emitter is naturally omni-directional. In view of practical applications, it is therefore essential to tailor this radiation pattern so as to ensure, e.g., a directional emission in free space, or a good coupling to an optical channel, such as an optical fibre. Generally speaking, such a tailoring is performed through an engineering of the electromagnetic environment of the emitter.

For quantum dots (QDs), the standard approach consists in embedding the quantum dot in an optical microcavity supporting discrete resonant modes, these modes having a low mode volume and a high quality factor. If the frequency of the quantum dot emission corresponds to one of the resonant modes frequencies (quantum dot and cavity mode in resonance), the spontaneous emission rate of the quantum dot into the cavity mode is strongly enhanced: this is the so-called Purcell effect. Due to this preferential coupling, a large fraction beta (beta~1) of the quantum dot spontaneous emission is funnelled into this resonant cavity mode. The emission diagram of the quantum dot-cavity system is then defined by the geometry of the microcavity. Assuming that a fraction (eta) of this radiation pattern is collected by optics elements, the source efficiency (epsilon), a key figure of merit for all potential applications, is the product beta*eta.

The Purcell approach has been successfully demonstrated with micropillars or two-dimensional photonic crystal cavities.

In the reference US2003/0152228 an optoelectronic component is disclosed which is capable of emitting light pulses containing a single photon comprising an optical resonant cavity and a photon emitting unit placed in said optical cavity.

However, the far field emission pattern of the required high-Q cavity is very sensitive to fabrication imperfections. Optimizing epsilon thus implies a trade-off between beta and the collection efficiency eta. Despite the significant technological progresses of the last years, epsilon remains limited to values around 40%. This limitation is even more serious in electrically pumped devices, because of supplementary optical losses introduced by the cavity doping. So far, the best reported efficiency in an electrically driven single photon source based on a cavity design is of about 14%, well below unity. Besides this drawback, the Purcell approach is only effective over the narrow bandwidth of the cavity resonance and is limited to monochromatic emitters, such as single quantum dots at cryogenic temperatures (T<100 K).

The reference "Single quantum dot nanowire LEDs", Minot E D et al., Nano Letters February 2007 American Chemical Society US, vol. 7, no. 2, pages 367-371 disclose fabrication of InP-InAsP nanowire light-emitting diodes in which electron-hole combination is restricted to a quantum-dot-sized InAsP section. The reference shows electroluminescence properties of an InP nanowire light emitting diode, and not a single photon source.

The reference "Optics with single nanowires", Zwiller V et al., Comptes Rendus—Physique, Elsevier, Paris, FR, vol. 9, no. 8, 1 Oct. 2008, pages 804-815, ISSN: 1631-0705 describes that heterostructures in nanowires can define quantum emitters and that single spins can be addressed optically. It also presents results on electrically contacted nanowires. The reference discloses a number of different embodiments from different academic research groups. The reference does not describe an effective, electrically driven single photon source.

The inventors of the present invention have appreciated that an improved single photon source is of benefit, and have in consequence devised the present invention.

SUMMARY OF THE INVENTION

It may be seen as an object of the present invention to provide an improved single photon source. Preferably, the invention alleviates, mitigates or eliminates one or more of the above or other disadvantages singly or in any combination.

In particular, it may be seen as an object of the invention to provide an electrically driven single photon source which has a high efficiency.

Accordingly there is provided, in a first aspect, a single photon source comprising:
   a nanowire with a first end and a second end, where at least
      a part of the first end is tapered, where the nanowire is
      made of a semiconductor material
   a first electrode, the first electrode being electrically
      coupled to a photon emitter, and
   a second electrode, the second electrode being electrically
      coupled to the photon emitter,
   wherein the photon emitter is located inside the nanowire and wherein the single photon source is capable of emitting a single photon when an activation voltage is applied between the first electrode and the second electrode.

A possible advantage of this invention is that an efficient, electrically driven single photon source is obtained. An advantage of having an electrically driven single photon source may include that such single photon source may be a compact, practical source of single photons.

It is understood, that a single photon source according to the invention is controllable so as to enable the emission of a single photon, i.e., one and only one photon upon application of the activation voltage between the first electrode and the second electrode.

Photons are generated in a material usually referred to as the active material, which in the present context may be embodied as a photon emitter. When an electrical pulse is applied, the electronic states in the conduction band in the active material are populated. In the process of electron-hole recombination, the electronic states are vacated and a single photon may be emitted.

The photon emitter may generally emit photons in all directions. To control the light emission it may be advantageous to place the photon emitter inside a nanowire, so that the photon emitter is enclosed within the nanowire, such as the photon emitter is completely enclosed within the nanowire, such as the photon emitter being enclosed within a solid angle of 4*PI by the nanowire. It is thus understood that the photon emitter is an inner element with respect to the nanowire which is an outer element. The nanowire is a passive material which does not generate photons but instead guides light along the axis of the nanowire. It is commonly understood within the art that a photon is a light particle, and that light may refer to a single photon or a plurality of photons.

This optimum effective diameter of the nanowire ensures good coupling between the photon emitter and the optical mode, however it is small compared to the optical wavelength, leading to a narrow optical mode profile and a highly divergent far field emission pattern. If the divergence is large, most of the light is not collected by the collection lens and the efficiency is compromised. For this reason it is necessary to expand the mode profile, such that the resulting far field emission pattern has a low divergence. In this case the emitted light will be directed towards the collection lens and a high efficiency is maintained. We perform this modal expansion by tapering of the nanowire, such as a regular or inverted tapering of the nanowire, inside which the optical mode is adiabatically expanded.

Note that the dimensions of the photon emitter may advantageously be smaller than those of the nanowire, and for this reason the photon emitter and the nanowire may advantageously be separate elements. An advantage of the photon emitter is the ability to generate light, such as the ability to emit a single photon, such as the ability to emit a single photon at a specific wavelength, and an advantage of the nanowire is the improved control of the light emission profile. In particular, the tapering section of the nanowire may serve to control the light emission profile of the nanowire (an outer element with respect to the photon emitter being an inner element) in order to improve the efficiency of the single photon source.

As a preferential mode of realization, one will use, as a photon emitter, a semiconductor quantum dot comprising InAs and embedded within a semiconductor nanowire comprising GaAs. However, other semiconductor quantum dot systems such as for instance InAs/InP, InGaN/GaN, GaN/AlN or CdTe/ZnTe, CdSe/ZnSe could be utilized as well. The emission wavelength of such quantum dots can be adjusted over a wide spectral range, such as 0.3-1.6 micrometer. Possible advantages of such emitters include that they could be used to build single photon sources working in the telecom windows, such as working at wavelengths around 850 nm, 1310 nm or 1550 nm, their stability over time (no bleaching, no blinking), and further that they can easily be embedded within a p-n semiconductor junction in view of electrical pumping. In one particular embodiment, a quantum dot is used as photon emitter, which quantum dot is sufficiently small so as to support only one electronic state. In this specific case, the Pauli exclusion principle still allows two electrons to be injected, given that the two electrons are in opposing spin states. The Coulomb interaction between the two electrons will cause the photons emitted upon electron-hole recombination to be emitted at two different specific wavelengths, and a spectral filter may ensure that only one photon is emitted through the spectral filter. However, for other photon emitters, it may be possible to store only one electron and emit only one photon. For example, if the binding energy of an electronic state in photon emitter is inferior to the Coulomb energy of the interaction between two electrons of opposing spins in the electronic state, in which case only one electron is supported by the electronic state, and only one photon is emitted upon electron-hole recombination.

Photon emitters which might be utilized also include single molecules, semiconductor nanocrystals, impurity atoms in semiconductors and colour-centres (known as F-centres), such as colour-centres in a solid-state material, such as colour-centres in diamonds. The F-centres are punctual defects, e.g., formed by the association of a vacancy and a nitrogen (Ni) impurity, which may be inserted on purpose in a solid-state material, such as diamond. Such emitters are able to generate single photons at temperatures around 300 K, and at a specific wavelength which depends on the nature of the punctual defect. PIN junctions have been fabricated with diamond, which opens the way toward an electrical pumping of F-centres in diamond in the future. A PIN junction is commonly understood in the art to be a junction comprising a p-type region, an undoped region (also known as an intrinsic region), and an n-type region. Other possible photon emitters include impurity atoms, such as a neutral isolated fluorine donor impurity in ZnSe, are able to bind a single electron-hole pair and to emit a single photon later on. The photon is emitted at a specific wavelength which depends on the nature of the impurity and of the semiconductor material into which it is inserted. For such a source, a fast recombination of the trapped electron-hole pair may be obtained, which is favourable for the emission of indistinguishable photons, as disclosed in the reference "Indistinguishable Photons from Independent Semiconductor Nanostructures", by K Sanaka et al. in Phys Rev Lett 103, 053601, 2009, which is hereby included by reference in its entirety. In a particular embodiment which may be advantageous, a plurality of single photon sources may be provided, wherein each single photon source in the plurality of single photon sources is capable of emitting a single photon of a specific wavelength which specific wavelength is identical for all the single photon sources in the plurality of single photon sources. In a further embodiment, the photon emitter in each single photon source in the plurality of single photon sources is chosen from the group comprising: F-centres and impurity atoms.

In a particularly advantageous embodiment, the nanowire is dimensioned so as to support one guided mode and one guided mode only. An advantage of this is that coupling to associated communication elements, such as fiber optical cables, is greatly simplified and improved.

It is understood that expressions, examples, calculations, and figures here and elsewhere in the description, claims, and figures which refer to the invention as comprising a nanowire supporting a single guided mode only are set forth for purposes of explanation rather than limitation, so as to provide a clear and thorough understanding of the present invention. However, it should be understood readily by those skilled in this art, that the present invention may be practiced in other embodiments, such as embodiments where more than one guided mode is contemplated, such as 2, 3, 4, 5 or more guided modes, which do not conform exactly to the details set forth herein, without departing significantly from the spirit and scope of this disclosure it is not intended to be limited to the specific form set forth herein.

A further advantage, in the context of single photon generation, might be that by replacing a high-Q cavity with a nanowire, such as a single mode nanowire, more robustness might be achieved with respect to fabrication imperfections, since fabrication imperfections might represent a source of uncontrolled light scattering which could lead to efficiency spoiling, since the single photon storage time in the nanowire is smaller by several orders of magnitude. Another potential advantage is that the spontaneous emission (SE) control by a nanowire is intrinsically broadband ((Delta lambda)/lambda ~1/10, where Delta lambda refers to a difference between an upper wavelength and a lower wavelength, respectively, where the nanowire confers spontaneous emission control) and applicable to non-monochromatic emitters. In the case of a bottom mirror comprising gold with a dielectric spacer, the operation wavelength of the source can be tuned over a large wavelength range, such as 70 nm for a design centred around lambda=950 nm, while preserving an efficiency larger than 90%.

It is understood that the application voltage might be a voltage pulse, such as a voltage pulse which is temporally shorter than the recombination time of the exciton. An advantage of this might be that if the voltage pulse temporally extends beyond the recombination time of the exciton, it might trigger the emission of another photon. In one example the recombination time of the exciton is in the order of 1 nanosecond, and the temporal width of the voltage pulse is in the order of 100 picoseconds.

The nanowire is understood to be an elongated body. A shape of a cross-section of the nanowire, in a plane orthogonal to a centre axis in a lengthwise direction of the nanowire, might typically be circular, or substantially circular. However, the invention is understood to comprise other shapes, as well, in particular other shapes such as elliptical, polygonal, rectangular, quadratic, or triangular. An advantage of a cross-section which is non-circular is that it might be possible to achieve polarization control and thus improved performance. It is further understood that expressions, examples, calculations, and figures here and elsewhere in the description, claims, and figures which refer to the invention as having a circular shape of a cross-section of the nanowire are set forth for purposes of explanation rather than limitation, so as to provide a clear and thorough understanding of the present invention. However, it should be understood readily by those skilled in this art, that the present invention may be practiced in other embodiments which do not conform exactly to the details set forth herein, without departing significantly from the spirit and scope of this disclosure it is not intended to be limited to the specific form set forth herein.

In a particular embodiment, there may be provided a single photon source comprising a nanowire, in which nanowire is located, such as enclosed, one and only one photon emitter. An advantage this may be, that a higher degree of control over photon emission may be obtained compared to a single photon source comprising a nanowire in which nanowire is located, such as enclosed, a plurality of photon emitters.

In another embodiment, there may be provided a single photon source wherein the photon emitter is enclosed within the nanowire, such as the photon emitter is completely enclosed within the nanowire, such as the photon emitter being enclosed within a solid angle of 4*PI by the nanowire.

In another embodiment, there may be provided a single photon source wherein the nanowire is of a first material, with a first refractive index (n_nw) and the nanowire is encircled by a first optical medium with a second refractive index (n_om1) where the first refractive index is larger than the second refractive index. An advantage of this is that a rate of spontaneous emission (G_rad) to radiation modes might be suppressed. It is understood that the first optical medium is located within a distance of the nanowire which makes its properties relevant for the rates of spontaneous emission, of the photon emitter, into the radiation modes and guided modes. Furthermore, it is understood that the first optical medium encircles the nanowire around a nanowire centre axis in the lengthwise direction, and that the first optical medium is substantially homogeneous from an optical point of view, but it could comprise different materials. The first optical medium might comprise materials of any phase, including solid materials, such as silicon dioxide or polymers or other solid materials, or gaseous media, such as air or nitrogen or other gaseous media.

In yet another embodiment, there may be provided a single photon source wherein an effective diameter (D_nw) of the nanowire at a portion along a length axis of the nanowire, the said portion comprising the position of the photon emitter, is arranged to suppress a rate (G_Rad) of spontaneous emission (SE) to radiation modes.

In yet another embodiment, there may be provided a single photon source wherein the nanowire has an effective diameter (D_nw) at a portion along a length axis of the nanowire, the said portion comprising the position of the photon emitter, and the nanowire is of a first material with first refractive index (n_nw) wherein the effective diameter (D_nw) of the nanowire at a portion along a length axis of the nanowire, the said portion comprising the position of the photon emitter, is within the range $$lambda/(3*n\_nw) < D\_nw < 2*lambda/n\_nw,$$

where n_nw is the first refractive index of the first material of the nanowire, and lambda is the wavelength of the emitted photon in free space, such as vacuum. The chosen range serves to suppress the rate (G_Rad) of spontaneous emission (SE) to radiation modes while the rate (G_HE11) of spontaneous emission into the fundamental guided mode of the nanowire is not suppressed. This range is estimated for geometries of the nanowire where the cross-section is circular, in a plane orthogonal to the length axis, and may be modified for other geometries of the nanowire.

For an optimum nanowire diameter, the photon emitter may couple almost all of the emitted photons, such as emitted by the photon emitter, into the nanowire, and therefore this diameter for the nanowire at the position of the photon emitter may be particularly advantageous.

Notice that the effective diameter, D_nw, may be defined as $$D\_nw = squareroot(4*S/pi)$$

where S is the area of the cross-section in a plane orthogonal to the length axis.

In yet another embodiment, there may be provided a single photon source further comprising a first optical element, the first optical element being a material arranged to reduce the reflection back into the nanowire of a photon travelling inside the nanowire in a direction towards the first end. This first optical element might comprise an anti-reflection coating, such as a layer of a transparent material.

In yet another embodiment, there may be provided a single photon source wherein the first optical element is an electrically conducting material. The electrically conducting material of the first optical element might comprise indium titanium oxide (ITO), however, it might also comprise other materials which are electrically conducting. An advantage of having a first optical element, which is of an electrically conducting material, is that it might simultaneously serve as part of the first electrode and as a part of an anti-reflection coating. A possible advantage of this might be that the efficiency, epsilon, of the single photon source is increased.

In yet another embodiment, there may be provided a single photon source further comprising a second optical element arranged to reflect a photon travelling inside the nanowire in a direction towards the second end. This second optical element might comprise a single reflective surface, such as a metallic surface, such as a gold surface. However, it might also comprise a plurality of layers, such as a periodic stack of layer-pairs, such as a distributed Bragg reflector (dBr). Alternatively it might comprise a combination of a least one transparent layer and a reflective surface.

In yet another embodiment, there may be provided a single photon source wherein the second optical element comprises an electrically conducting material. The electrically conducting material of the first optical element might comprise indium titanium oxide (ITO), however, it might also comprise other materials which are electrically conducting. An advantage of having a second optical element which is of an electrically conducting material is, that it might simultaneously serve as part of the second electrode and as a part of a reflective element. A possible advantage of this might be that the efficiency, epsilon, of the single photon source is increased.

In yet another embodiment, there may be provided a single photon source wherein the second optical element comprises
    a reflective surface
    a surface of the second end of the nanowire
    an interfacial second optical medium located between the metallic surface and the surface of the second end of the nanowire, where the second optical medium is transparent and electrically conducting. The reflective surface might be a surface which is reflective if the dimensions are macroscopic, such as a metallic surface, such as a gold surface. The electrically conducting material of the first optical element might comprise indium titanium oxide (ITO), however it might also comprise other materials which are electrically conducting. An advantage of having a second optical element which is of an electrically conducting material is, that it might simultaneously serve as part of the second electrode and as a part of a reflective element. A possible advantage of this might be that the efficiency, epsilon, of the single photon source is increased.

In yet another embodiment, there may be provided a single photon source wherein the tapering is given by a decreasing effective diameter of the nanowire which, at least along a portion of the nanowire, is decreasing in a direction towards the first end. An advantage of this tapering might be that it confers an adiabatic expansion of the optical mode, and a possible consequence of the adiabatic expansion is that the single photon emitted from the single photon source is more likely to be emitted within a narrow solid angle.

In yet another embodiment, there may be provided a single photon source wherein the tapering is given by an increasing effective diameter of the nanowire which, at least along a portion of the nanowire, is increasing in a direction towards the first end. An advantage of this tapering might be that it confers an adiabatic expansion of the optical mode, and a possible consequence of the adiabatic expansion is that the single photon emitted from the single photon source is more likely to be emitted within a narrow solid angle.

In yet another embodiment, there may be provided a single photon source wherein the first end of the nanowire is substantially planar. An advantage of having a substantially planar first end of the nanowire might be that an interface, which is substantially orthogonal to the lengthwise axis of the nanowire, between the nanowire and an optical element is larger.

In yet another embodiment, there may be provided a single photon source, wherein the photon emitter is capable of emitting a single photon at a specific wavelength. If the volume of the active material is so small that electronic states are discretized, there may be emitted a plurality of photons, however, the photons emitted after a pumping pulse are each emitted at a specific wavelength, which specific wavelength is different from the specific wavelength(s) of the other emitted photon(s). It may also be the case, that only a single photon is emitted, in which case the single photon is also emitted at a specific wavelength. Thus only one photon is emitted per electrical pulse, such as an activation voltage, at a specific wavelength of interest, such as a specific wavelength corresponding to the emission line for the photon emitter upon recombination of an electron-hole pair from a state where only one electron-hole par was excited. The small volume of the active material leading to a discretization of the electronic states may be advantageous for single-photon generation. Quantum dots in particular usually feature such a small volume. This is further discussed in the article "Strong Purcell Effect for InAs Quantum Boxes in Three-Dimensional Solid-State Microcavities", Jean-Michel Gerard and Bruno Gayral, J. Lightwave Technol. 17, 2089-(1999) which is hereby incorporated by reference in its entirety.

In yet another embodiment, there may be provided a single photon source, which single photon source further comprises a spectral filter. A spectral filter may be advantageous in that it may be used to select the single photon emitted at the specific wavelength of interest. In case there is a plurality of photon emitters emitting at different wavelengths, such as quantum dots with different sizes, which plurality of photon emitters is present and pumped simultaneously, a spectral filter may be advantageous in that it may be used to select the single photon emitted at the specific wavelength of interest, through the selection of the emission of one of the emitted photons from one of the single photon emitters at a specific wavelength of interest. The spectral filter may be a filter having relatively high transmission of light in a range of wavelengths, while transmission of light in other wavelengths is relatively low. Particularly, the spectral width of the filter may be chosen so as to have high transmission in a spectral range covering the specific wavelength of interest, while having low transmission in a range, or a plurality of ranges, covering other specific wavelengths. The spectral filter may be realized in a number of particular embodiments, as will be known to the person skilled in the art.

In yet another embodiment, there may be provided a single photon source wherein the nanowire comprises GaAs and the photon emitter comprises InAs or InGaAs and/or wherein the nanowire comprises InP and the photon emitter comprises InAs or InAsP.

In yet another embodiment, there may be provided a single photon source, wherein the photon emitter is a quantum dot. In a particular embodiment, the quantum dot may be sufficiently small so that the electronic states in the quantum dot are discretized. In yet another particular embodiment, the quantum dot may be sufficiently small so that only one electronic state is supported.

In yet another embodiment, there may be provided a single photon source wherein the nanowire comprises diamond and the photon emitter is a colour centre. The colour-centres are also known as F-centres in diamonds. The F-centres are punctual defects, e.g., formed by the association of a vacancy and a nitrogen (Ni) impurity, which can be inserted on purpose in diamond. Such emitters are able to generate single photons at temperatures around 300 K, and at a specific wavelength which depends on the nature of the punctual defect.

In yet another embodiment, there may be provided a single photon source wherein the single photon is emitted with a wavelength, in free space, within the telecom windows, such as wavelengths around 850 nm, 1310 nm or 1550 nm.

In yet another embodiment, there may be provided a single photon source wherein the first optical medium comprises a gas. The gas might be air, pure gases, such as helium (He), nitrogen ($N_2$), carbon oxides (e.g., CO or $CO_2$), or compositions thereof. An advantage of using a gas might be that very low refractive indices can be obtained with gases, and consequently a low second refractive index of the first optical medium. Having a low second refractive index of the said first optical medium for a given first refractive index of the nanowire increases the ratio between the first refractive index and the second refractive index, and this might be advantageous in order to achieve an efficient single photon source.

In yet another embodiment, there may be provided a single photon source further comprising a plasmonic collimator. An advantage of having a plasmonic collimator may be, that the beam divergence may thus be optimized, such as the divergence angle being decreased. Another possible advantage is that the efficiency may be increased. In a particular embodiment, the plasmonic collimator may comprise grooves and/or metallic strips in a metallic layer at a point of emission of a single photon. In another particular embodiment, the grooves and/or metallic strips may form a grating.

In a second aspect of the invention, there may be provided a device for optical communication comprising a single photon source according to the first aspect of the invention.

In a third aspect of the invention, there may be provided a method of generating a single photon, the method comprising applying an activation voltage between a first electrode and a second electrode in a single photon source according to the first aspect of the invention. The method might be advantageous in that the single photon source according to the first aspect of the invention can yield a high efficiency and reliably generate single photons.

In a fourth aspect of the invention, the invention relates to use of the single photon source according to the first aspect of the invention for generating a single photon.

When referring to an advantage, it must be understood that this advantage may be seen as a possible advantage provided by the invention, but it may also be understood that the invention is particularly, but not exclusively, advantageous for obtaining the described advantage.

In general the various aspects and advantages of the invention may be combined and coupled in any way possible within the scope of the invention.

These and other aspects, features and/or advantages of the invention will be apparent from and elucidated with reference to the embodiments described hereinafter.

BRIEF DESCRIPTION OF THE DRAWINGS

Embodiments of the invention will be described, by way of example only, with reference to the drawings, in which.

DESCRIPTION OF EMBODIMENTS

Figure 1:
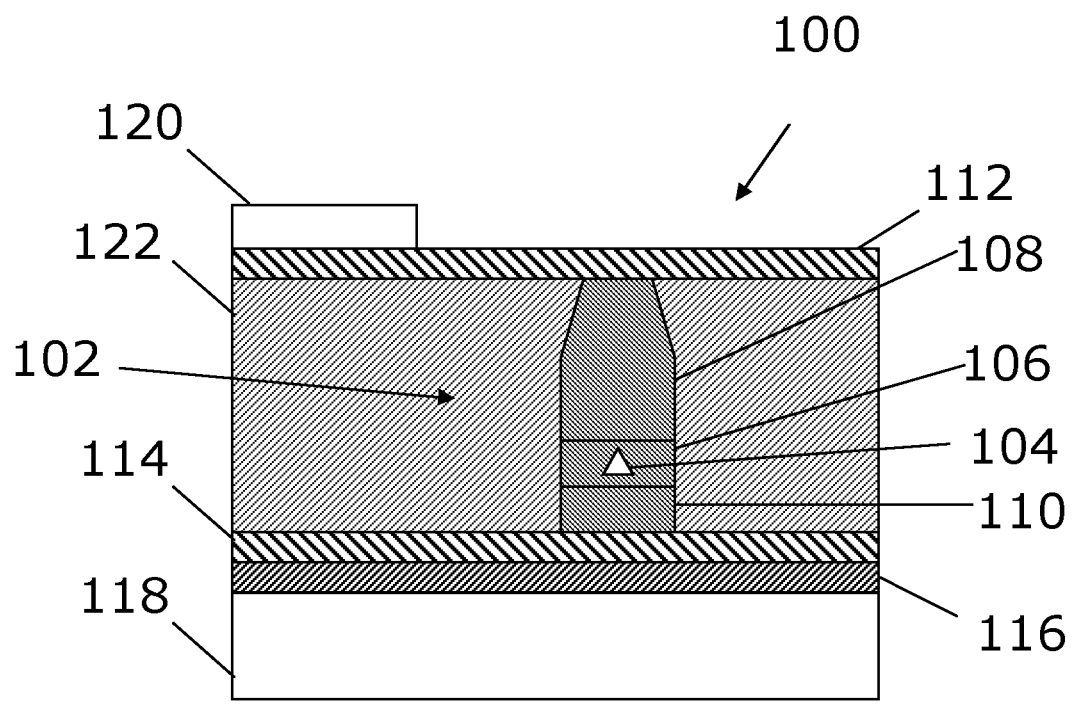
FIG. 1 shows a first embodiment of the invention.

An embodiment of the invention is illustrated in FIG. 1 showing a single photon source 100 comprising a nanowire 102 which is tapered in a first end which in the figure is the upper end of the nanowire 102, the upper part of the nanowire has a top diameter which decreases towards the first end, a first electrode comprising contact pad 120 and a first indium tin oxide (ITO) layer 112, and further a second electrode comprising a second indium tin oxide (ITO) layer 114. Although both first and second electrodes comprise ITO in the present embodiment, it is understood that other materials might be comprised as well, in particular other materials which are optically transparent and electrically conducting. The nanowire 102 comprises a p-type zone 108, an n-type zone 110 and an intrinsic region 106 wherein a photon emitter 104 is embedded, the photon emitter being a quantum dot (QD) in the shown embodiment. The figure also shows a planarizing polymer 122, the planarizing polymer constituting the first optical medium in the shown embodiment, and further constituting a substantially planar surface onto which other elements, such as the first indium tin oxide (ITO) layer 112, can be placed. The figure further shows a substrate 118 and a metallic layer 116 which in the shown embodiment is gold, however, it is understood that it might also be other similar materials, such as other conducting materials, such as silver, copper or others. The shown embodiment features a GaAs nanowire 102 containing an InAs quantum dot 104 located on the wire axis, with an emission wavelength in free space of about 950 nm. The embodiment further features a mirror comprising a gold layer 116 and an approximately 13 nm thick spacer layer 116 comprising indium tin oxide (ITO). Alternatively, another transparent conductive oxide could be used, provided the layer thickness is optimized accordingly. This mirror design is chosen because of its broadband reflectivity. In the embodiment in FIG. 1, it is exploited that the taper can be truncated to implement a top semitransparent_ITO contact 112, which in the shown embodiment is approximately 135 nm thick. In general, the thickness of the semitransparent layer can favourably be dimensioned approximately by $$D\_sl = lambda/(4*n\_sl),$$

where D_l is the thickness of the semitransparent layer, lambda is the wavelength, and n_l is the refractive index of the semitransparent layer. In the shown embodiment the photon emitter 104 is a quantum dot and the nanowire 102 is a GaAs semiconductor structure, however, in other embodiments the photon emitter might be a colour-centre embedded in a diamond nanowire, such embodiment being described as a single photon source comprising a nanowire with a first end and a second end, where at least a part of the first end is tapered, where the nanowire is made of a diamond, a first electrode, the first electrode being electrically coupled to a photon emitter, and a second electrode, the second electrode being electrically coupled to the photon emitter, wherein the photon emitter is located inside the nanowire and capable of emitting a single photon when an activation voltage is applied between the first electrode and the second electrode. In a particularly advantageous embodiment, the nanowire 102 supports only one guided mode. It is noted that analogously to the discretization of energy levels of a particle in a potential well described using the Schroedinger equation, the Maxwell equations result in a discretization of one or more guided modes in a material with a higher refractive index than a refractive index of a surrounding material.

Notice that in this figure and the following figures, all calculations, including calculations presented in graphs are made for an embodiment comprising an InAs quantum dot (QD) in a GaAs nanowire which is emitting a single photon at a wavelength of 0.95 micrometer. It is understood that expressions, examples, calculations, and figures here and elsewhere in the description, claims, and figures which refer to the invention as comprising an InAs quantum dot (QD) in a GaAs nanowire which is emitting a single photon at a wavelength of 0.95 micrometer, are set forth for purposes of explanation rather than limitation, so as to provide a clear and thorough understanding of the present invention. However, it should be understood readily by those skilled in this art, that the present invention may be practiced in other embodiments which do not conform exactly to the details set forth herein, without departing significantly from the spirit and scope of this disclosure it is not intended to be limited to the specific form set forth herein.

Figure 2:
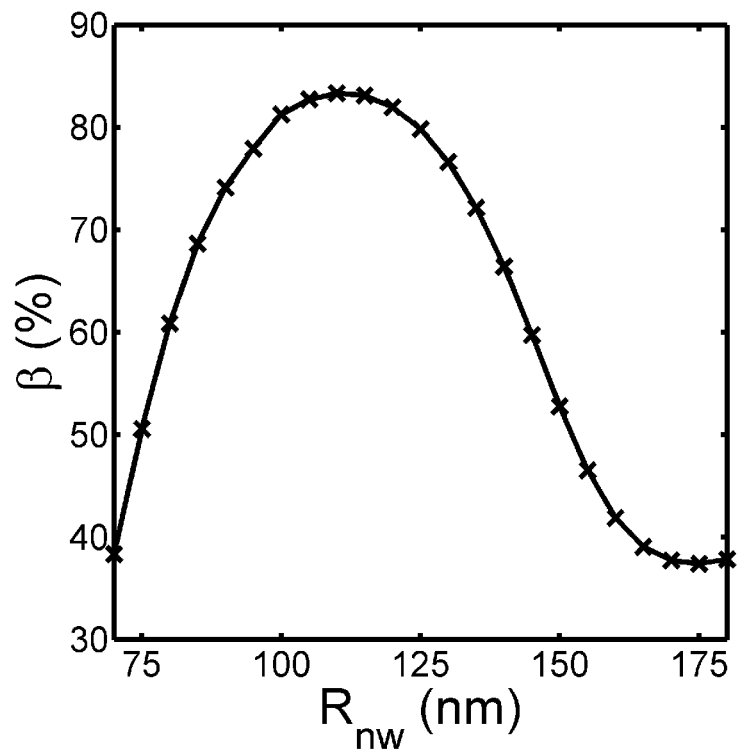
FIG. 2 shows the mode coupling factor (beta) as a function of a nanowire radius.

FIG. 2 shows the mode coupling factor (beta) as a function of the GaAs nanowire radius R_nw, for a cylindrical wire with a circular cross-section, encircled by a first optical medium, the first optical medium in the shown embodiment being a polymer cladding. The calculations considered a GaAs nanowire containing an InAs quantum dot located on the wire axis and emitting a single photon around 950 nm. In the simplest approach, the deposition of a top electrode implies a planarization of the structure. Since high beta in photonic wires results from a so-called screening effect which is linked to the refractive index contrast between the wire material and the cladding, beta is expected to slightly decrease when air is replaced by a planarizing polymer, with a refractive index around 1.5-1.6. Calculations shown in FIG. 2 confirm this qualitative analysis. The optimal value of beta in a planarized wire is 83% (compared to 95% for a GaAs nanowire with an air cladding), obtained for d=220 nm (instead of 210 nm for an air cladding).

As another example, a GaAs wire surrounded by air with an embedded InAs quantum dot (QD) is studied. The fundamental optical transition wavelength of the photon emitter is lambda=950 nm in free space. It is located on a GaAs wire axis and displays a radial dipole moment. For an optimal wire diameter d0 of d0=0.22*lambda, the wire sustains a single guided mode, HE11, and the fraction (beta) of spontaneous emission (SE) coupled to the fundamental guided mode HE11 reaches 95%. Such a high value results from an optimal confinement of the mode HE11 combined to a very strong inhibition of spontaneous emission (SE) in the other electromagnetic modes. Moreover, beta exceeds 90% for a wide range of diameters, from 0.20*lambda to 0.29*lambda. Such a tolerance, which relaxes fabrication constraints, also indicates a broadband spontaneous emission (SE) control, which could be in particular be applied to non-monochromatic emitters.

Figure 3:
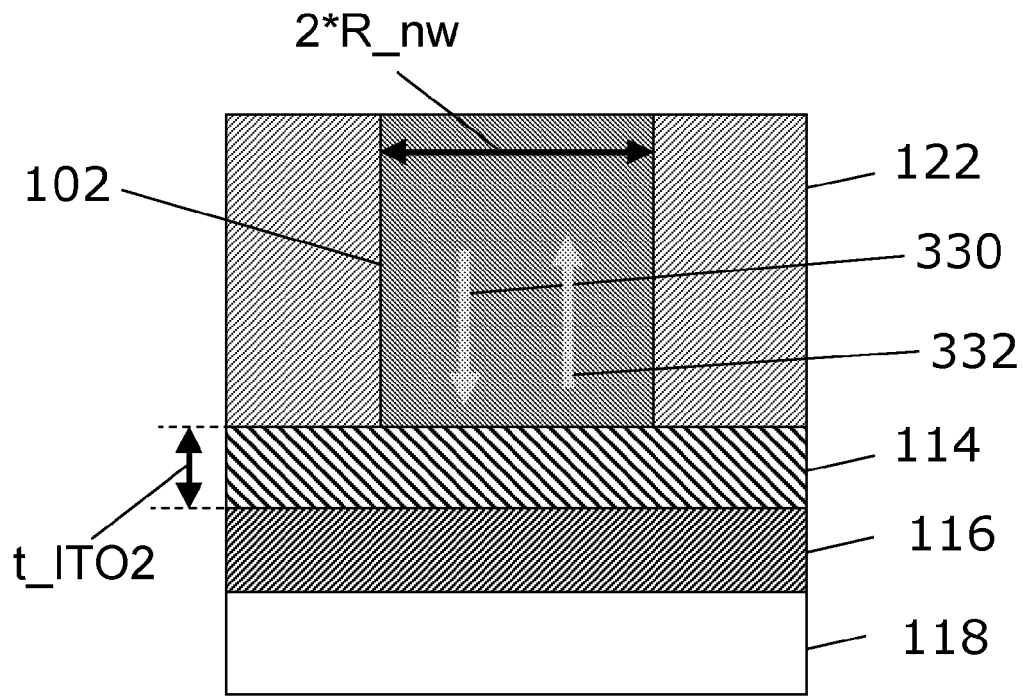
FIG. 3 shows a schematic illustration of a second end of a nanowire single photon source with a reflective element.

FIG. 3 shows a schematic illustration of a second end of a nanowire 102 single photon source with a second optical element, which in the shown embodiment comprises a reflective element and a transparent layer. The illustration might be similar to a part of the illustration in FIG. 1, but it might also be representative for other embodiments of the invention. The present embodiment features a gold layer 116, a transparent dielectric indium titanium oxide (ITO) layer 114, a part of the nanowire 102, a planarizing polymer 122, and a substrate 118. In the figure, single-headed arrows illustrate the directions of a single photon travelling towards the second end 330, and towards the first end 332, respectively. A gold mirror is interesting because of its broadband reflectivity. Previous calculations, however, have shown that a simple gold layer displays a poor reflectivity for the guided mode, HE11, in the diameter range corresponding to an optimal coupling of this mode. This is due to a detrimental coupling to plasmons, which can be largely suppressed by the addition of a low refractive index spacer between the gold mirror and the nanowire. In the present case, this spacer should be also compatible with electrical pumping. The figure thus features indium titanium oxide (ITO), which has a refractive index given by n_ITO=1.75+0.02i. The radius of the nanowire 102 is given by R_nw, and the thickness of the spacer layer 112 is given by t_ITO2.

Figure 4:
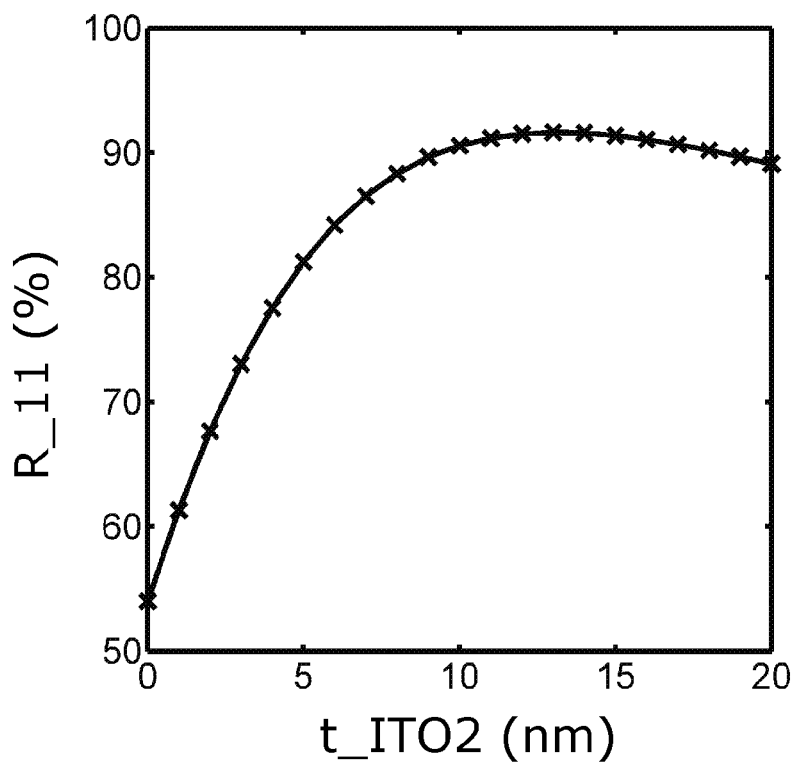
FIG. 4 shows a reflectivity of the second optical element as function of bottom contact thickness.

FIG. 4 shows a reflectivity R_11 of the second optical element, such as the second optical element shown in FIG. 3, for the fundamental guided mode, HE11, as function of the indium titanium oxide (ITO) bottom contact thickness, t_ITO2. Calculations are done for a radius of the nanowire of R_nw=110 nm, and show that a modal reflectivity of 92% is obtained with an indium titanium oxide (ITO) spacer of thickness, t_ITO2=13 nm.

Figure 5:
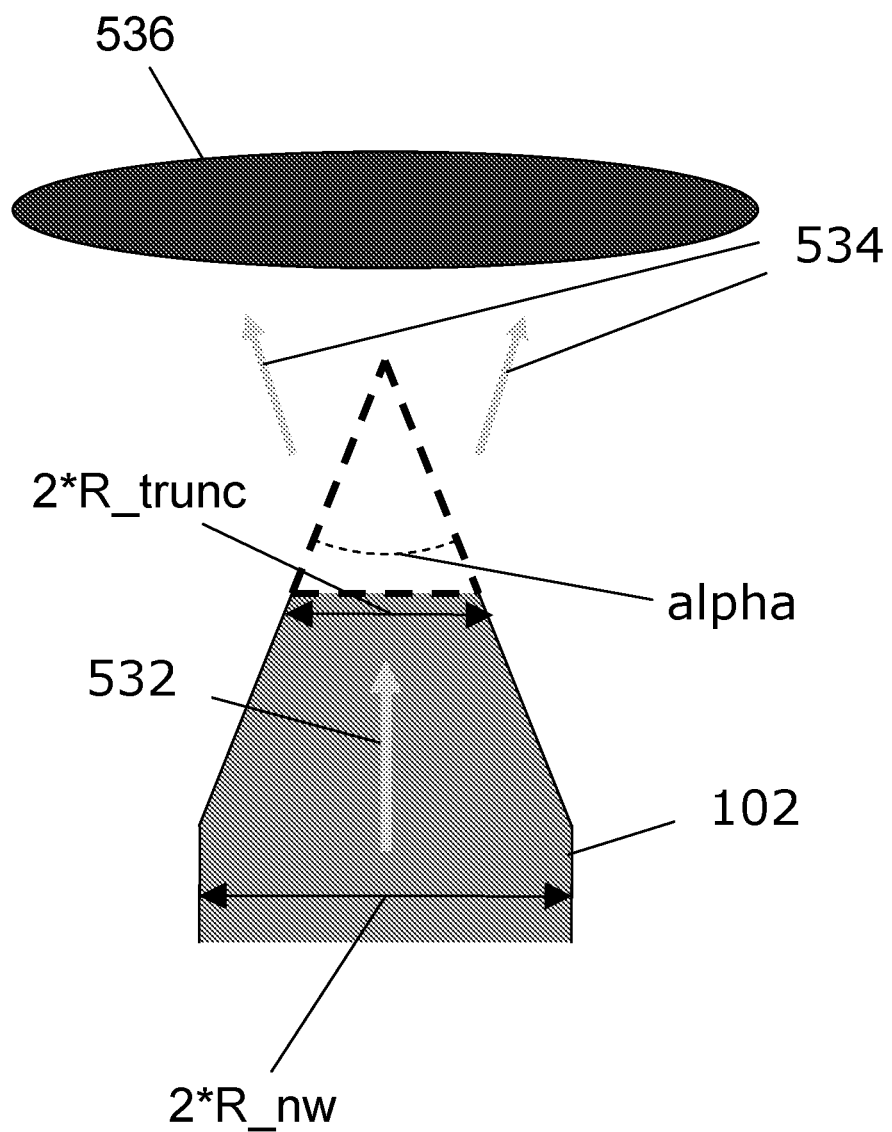
FIG. 5 shows a schematic illustration of a first end of a nanowire which is tapered.

FIG. 5 shows a tapering of the nanowire 102. The taper is advantageously implemented in order to refocus the far-field emission pattern along the wire axis, to ensure an efficient light collection with a microscope objective, which in the shown embodiment is a lens 536, having a standard numerical aperture (NA). In the figure, a direction of a single photon travelling inside the nanowire 102 towards a first end of the nanowire is shown by arrow 532, while possible directions of a single photon emitted from the nanowire are shown by arrows 534. The idea is to adiabatically transform the optimally confined HE11 mode into a plane wave-like mode, with larger lateral dimensions. In the shown embodiment, the tapering is given by a decreasing effective diameter towards the first end of the nanowire. In that case, the mode is progressively deconfined into the cladding polymer. A total tapering angle alpha smaller than 5° ensures that 90% of incoming light is collected with a NA=0.8 objective, where NA is the numerical aperture of the objective. Moreover, the tip can be truncated as soon as the wire diameter is below 150 nm, leading to a more practical solution, especially for electrical top contacting. The radius of the nanowire is given by R_nw, the radius at a point where the nanowire is truncated is given by R_trunc.

Figure 6:
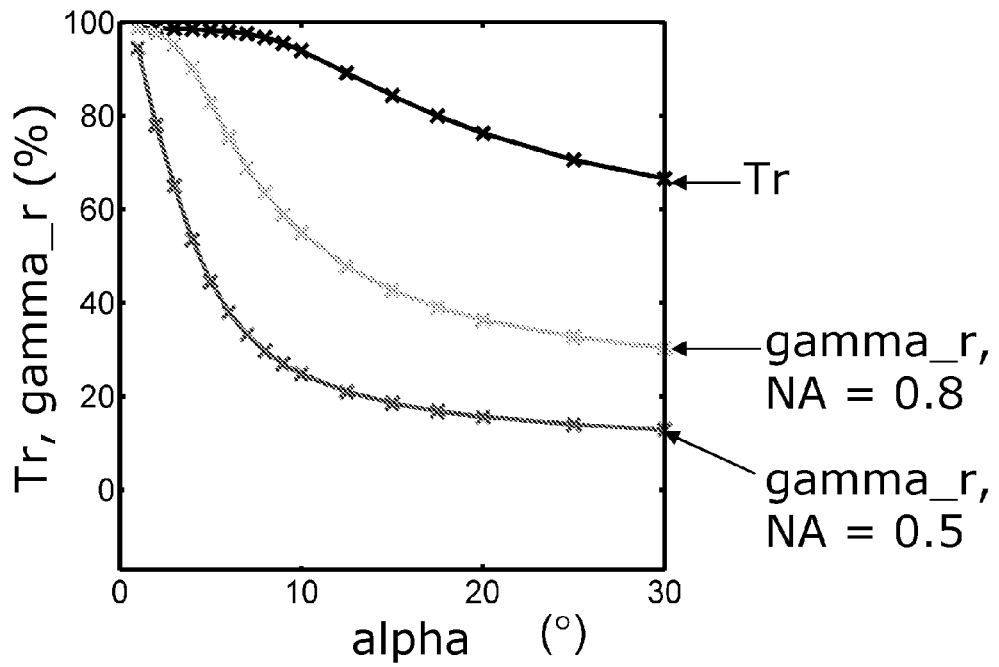
FIG. 6 shows total transmission and relative collection efficiency as function of opening angle for a perfectly conical tip.

FIG. 6 shows the total transmission Tr and relative collection efficiency gamma_r relative to the power of the fundamental guided mode for 0.5 and 0.8 numerical aperture (NA) lenses as function of opening angle alpha for a perfectly conical tip, such as the tip and lens depicted in FIG. 5 where the tip comprises the upper triangular part enclosed by thick dotted lines. Calculations are done for a radius of the nanowire with radius R_nw=110 nm.

Figure 7:
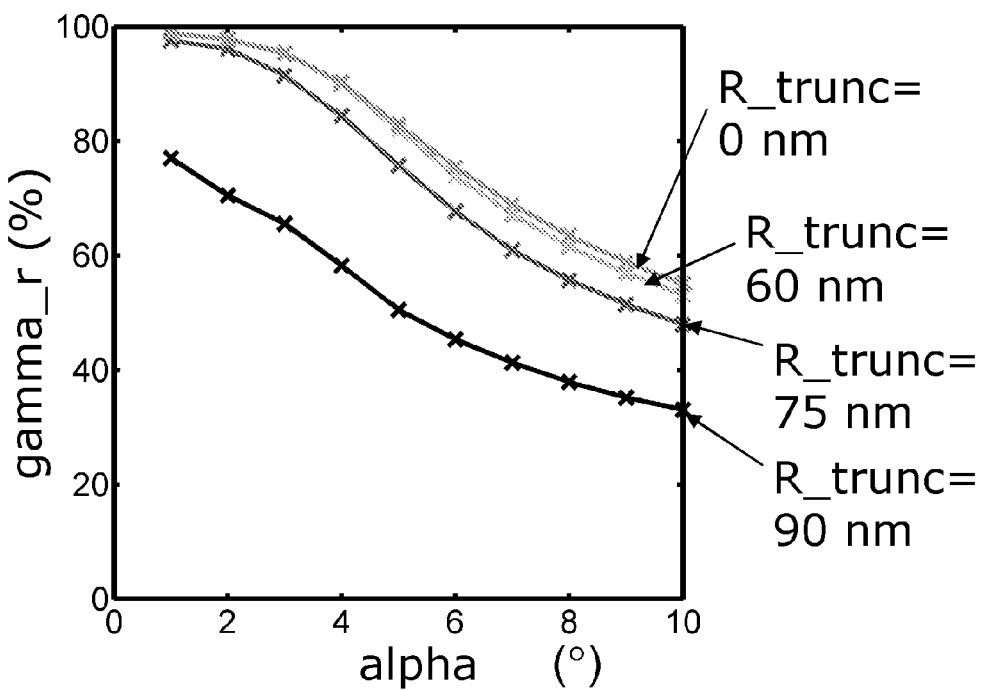
FIG. 7 shows relative collection efficiencies as function of opening angle for various values of top diameter.

FIG. 7 shows relative collection efficiency gamma_r for a 0.8 NA lens as function of opening angle alpha for various values of R_trunc, for the lens and truncated nanowire depicted in FIG. 5. Calculations are done for a radius of the nanowire given by R_nw=110 nm.

Figure 8:
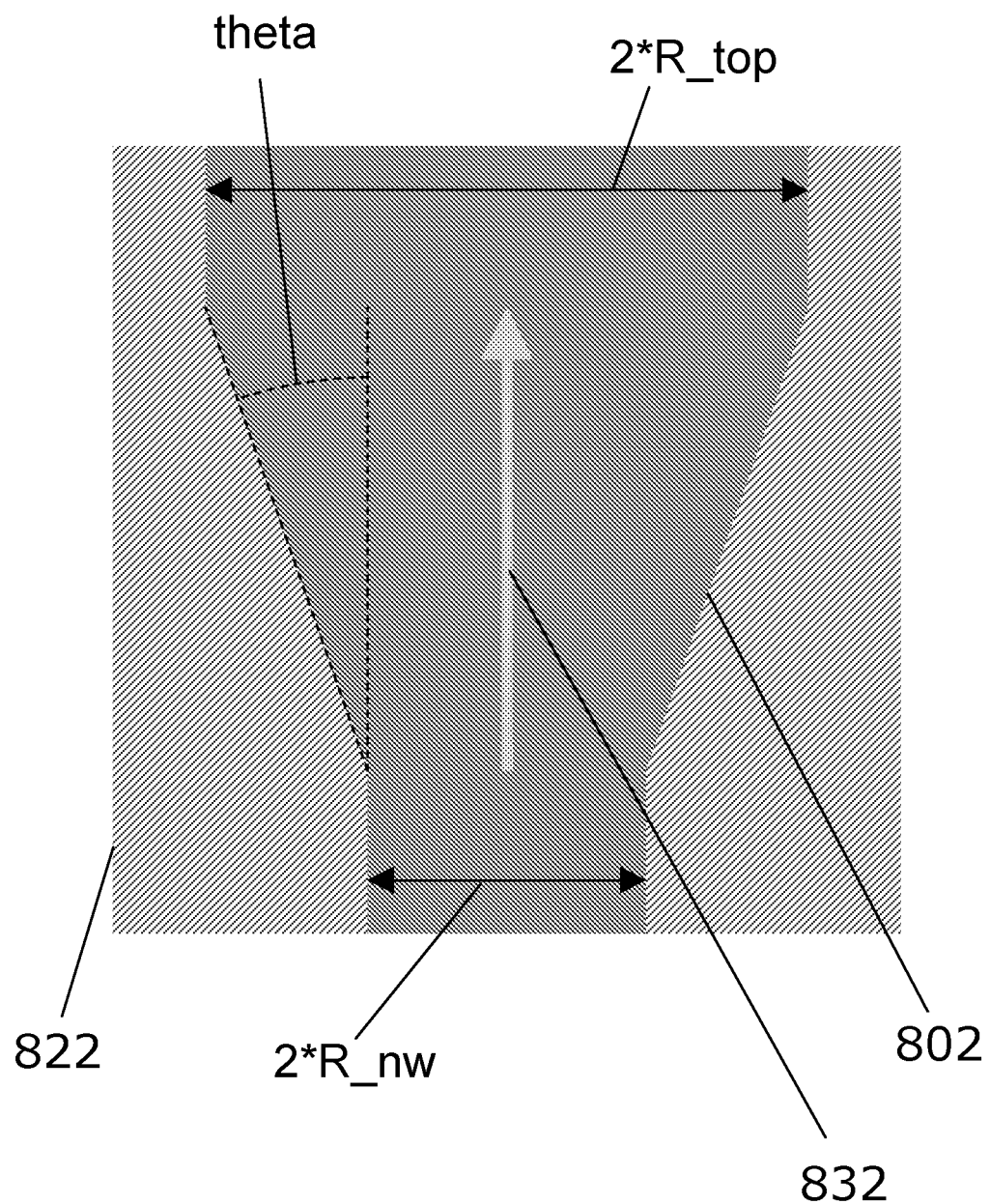
FIG. 8 shows a schematic illustration of another embodiment with a tapered nanowire.

FIG. 8 shows another embodiment with a tapered nanowire 802 and also shown is a planarizing polymer 822. The arrow 832 indicates a direction of a single photon travelling inside the nanowire 102 in a direction towards the first end. The shown embodiment has a tapering where the effective diameter increases towards the first end, which in the figure is the upper end, particularly the shown embodiment leads to an adiabatic increase of the wire diameter. In that case, the guided mode expands inside the wire. When the top facet radius, R_top, exceeds 0.8 micrometer, the output beam divergence is strongly reduced and collection by a NA=0.8 objective is better than 95%.

Figure 9:
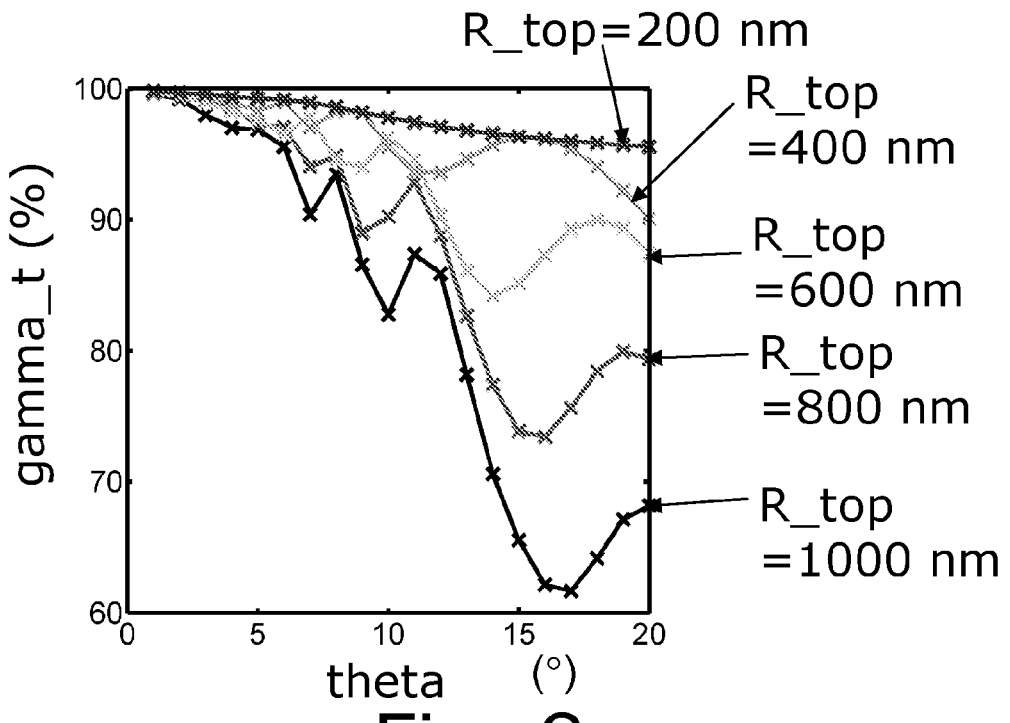
FIG. 9 shows transmission of the fundamental guided mode as function of the radius of the top part of the nanowire and side wall angle.

FIG. 9 shows the transmission gamma_t of the fundamental HE11 mode through the tapering as function of the radius, R_top, of the top part of the nanowire and side wall angle theta for a nanowire geometry as depicted in FIG. 8. Calculations are done for a radius of the nanowire given by R_nw=110 nm.

Figure 10:
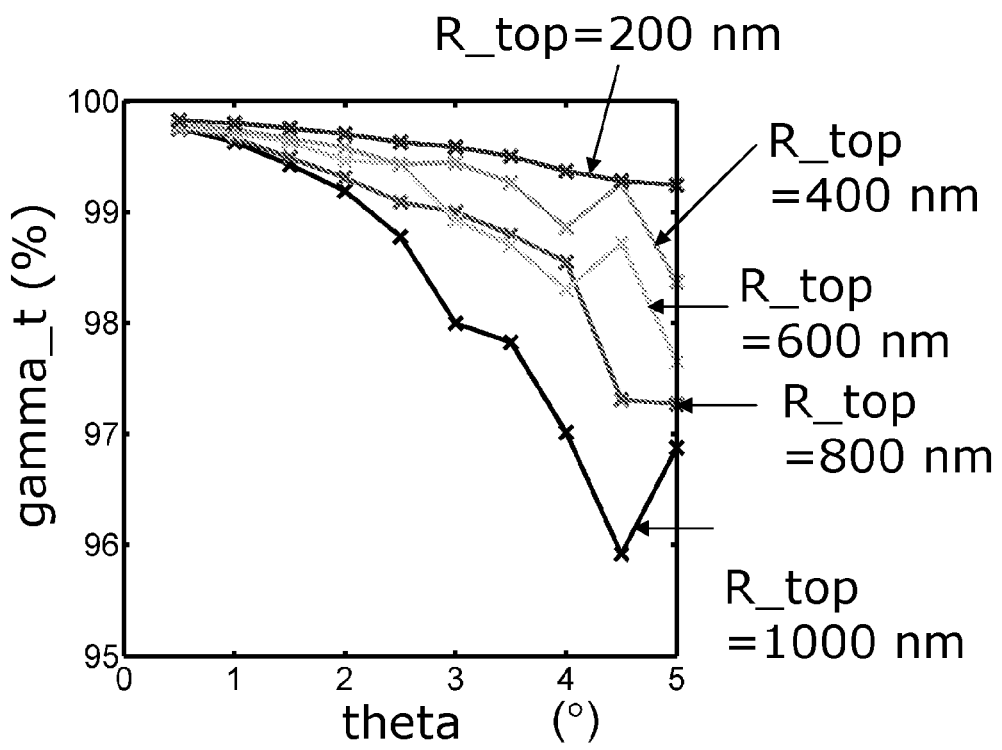
FIG. 10 shows a zoom-in for small angles.

FIG. 10 shows a zoom-in, of the graph also shown in FIG. 9, for small angles. Calculations are done for a radius of the nanowire given by R_nw=110 nm.

As shown in FIGS. 9-10, a total tapering angle theta of 10° leads to a modal transmission through the taper of about 97%. The resulting height of the whole structure, of about 10 micrometer, is compatible with methods of fabrication. To finish, a fraction of light in the HE11 mode is reflected back on the top facet, due to the refractive index contrast between GaAs and air. This reflection can be nearly perfectly suppressed using a standard anti-reflection coating, such as a coating of a material such as silicon dioxide ($SiO_2$), silicon nitride (e.g., $Si_3N_4$), or indium titanium oxide (ITO).

Figure 11:
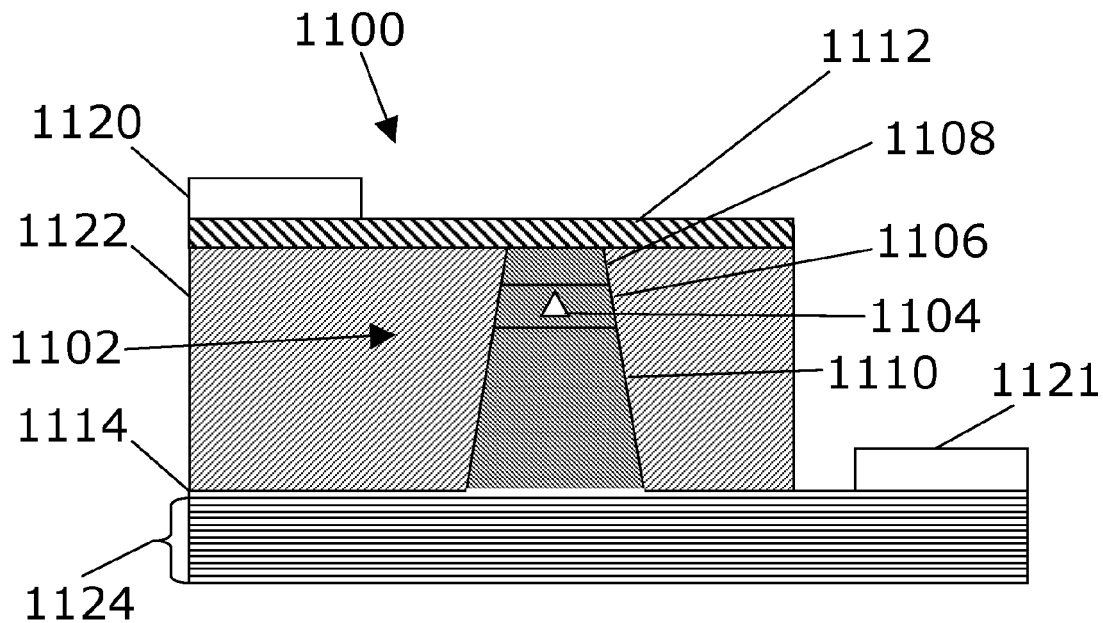
FIG. 11 shows another embodiment of the invention which features a planar distributed Bragg reflector.

FIG. 11 shows another embodiment of the invention which features a planar distributed Bragg reflector 1124 which is more adapted to a bottom-up fabrication of the single photon source nanowire structure. Because of the small angular acceptance of the planar distributed Bragg reflector 1124, the divergence of the HE11 mode at the wire-mirror interface, between nanowire 1102 and distributed Bragg reflector 1124, has to be reduced. This is done by increasing the wire diameter up to 1 micrometer. Notice that although the embodiment utilizes a transparent layer covering the first end of the nanowire for electrically contacting the nanowire, a layer which is penetrated by the nanowire could also be used. The figure further shows a single photon source 1100 comprising a nanowire 1102 which is tapered, the effective diameter of the wire is decreasing towards the first end, which in the figure is the upper end of the nanowire 1102, a first electrode comprising a first contact pad 1120 and a first indium tin oxide (ITO) layer 1112, and further a second electrode comprising a second contact pad 1121 and a second indium tin oxide (ITO) layer 1114. The nanowire 1102 comprises a p-type zone 1108, an n-type zone 1110 and an intrinsic region 1106 wherein a photon emitter 1104 is embedded, the photon emitter being a quantum dot (QD) in the shown embodiment. The figure also shows a planarizing polymer 1122.

In another embodiment of the invention, the second indium tin oxide (ITO) layer 1114 is omitted and the top layer of the distributed Bragg reflector 1124, being the layer in physical contact with the nanowire 1102, is electrically conducting and electrically connected to the second end of the nanowire 1102, such that this layer can be used as part of the second electrode. In a particular embodiment, the layer 1114 is replaced with a doped semiconductor layer, such as GaAs. The distributed Bragg reflector (dBr) might also comprise one or more doped layers. The doping might favourably be of the same kind as the bottom part of the nanowire 1102, i.e. n type in the present embodiment, since the bottom part of the nanowire in the present depicted embodiment comprises the n-type zone 1110.

Figure 12:
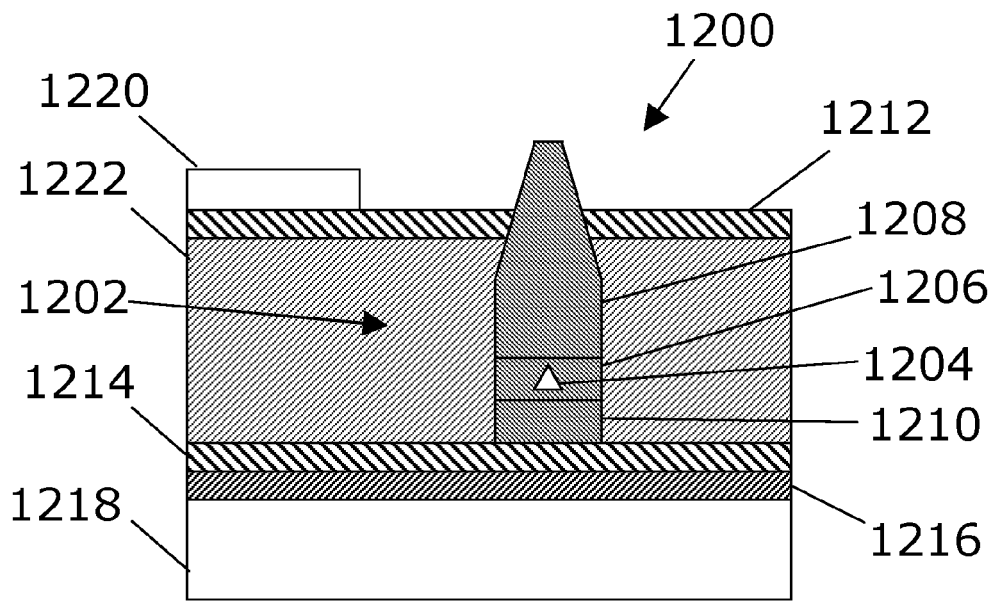
FIG. 12 shows another embodiment of the invention, the embodiment having a tapered nanowire with an effective diameter which is decreasing towards the first end of the nanowire.

FIG. 12 shows yet another embodiment of the invention, the embodiment having a tapered nanowire with an effective diameter which is decreasing towards the first end of the nanowire. Furthermore, the shown embodiment features a lateral indium titanium (ITO) contact 1212. The figure further shows a single photon source 1200 comprising a nanowire 1202 which is tapered in a first end which in the figure is the upper end of the nanowire 1202, the upper part of the nanowire has a top diameter which decreases towards the first end, a first electrode comprising contact pad 1220 and a first indium tin oxide (ITO) layer 1212, and further a second electrode comprising a second indium tin oxide (ITO) layer 1214 The nanowire 1202 comprises a p-type zone 1208, an n-type zone 1210 and an intrinsic region 1206 wherein a photon emitter 1204 is embedded, the photon emitter being a quantum dot (QD) in the shown embodiment. The figure also shows a planarizing polymer 1222, a metallic layer 1216 which in the shown embodiment is gold, and a substrate 1218. In the embodiment shown in FIG. 11, the contact strategy is similar to the contact strategy utilized in the embodiment shown in FIG. 1, however, the contact strategy depicted in the embodiment shown in FIG. 12 could also apply.

Notice that in this and other depicted embodiments, the p-type zone is shown in the figures as being in the upper part of the nanowire, while the n-type zone is shown as being in the lower part of the figure. However, in other embodiments the positions of the n-type zone and the p-type zone might be interchanged. It is further noted, that it might be advantageous to use the type of doping, which entails the lowest resistivity, in the longest part of the top- and bottom parts, while using the opposite type of doping in the other part.

Figure 13:
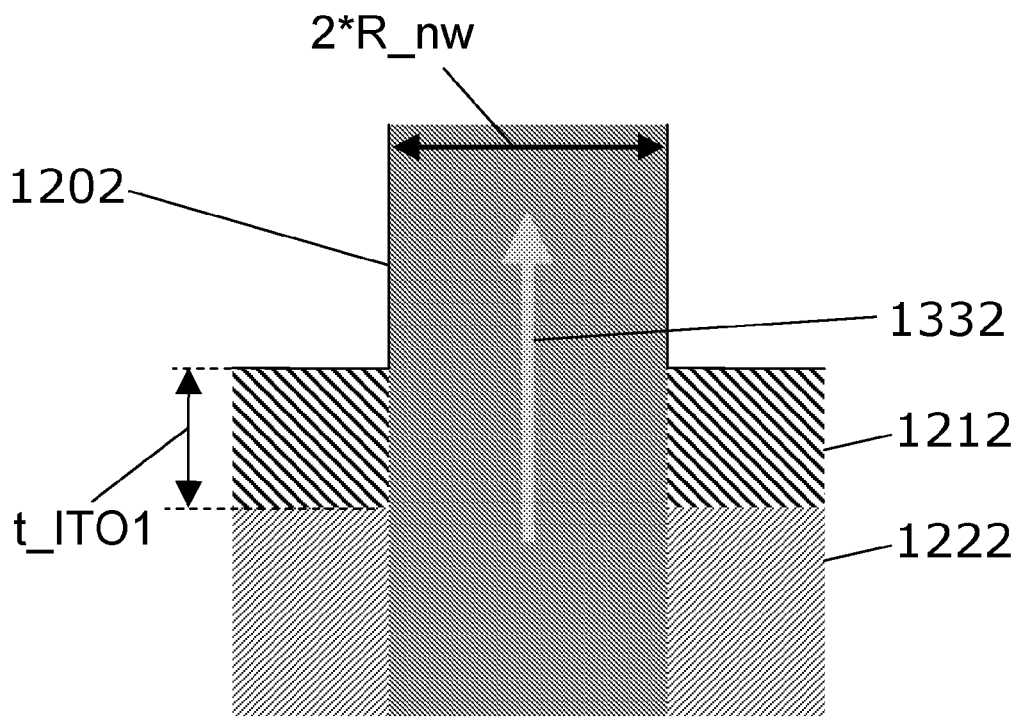
FIG. 13 shows a schematic illustration of a first end of a nanowire with a lateral electrode.

FIG. 13 shows a schematic illustration of a first end of a nanowire with a lateral electrode. The illustration might be similar to a part of the illustration in FIG. 12, but it might also be representative for other embodiments of the invention. The present embodiment features a first end of the nanowire 1202, a lateral electrode 1212, and a planarizing polymer 1222. The arrow 1332 indicates a direction of travelling of a single photon travelling in a direction towards the first end of the nanowire. The nanowire 1202 has an effective diameter 2*R_nw, and the thickness of the layer which in the present embodiment constitutes the lateral electrode is given by t_ITO1. The electrical contact is ensured by the lateral electrode 1212. For the typical effective diameters leading to efficient spontaneous emission (SE) control, the amplitude of the mode HE11 is not negligible outside the nanowire. Thus, in particularly advantageous embodiments, the electrode can be made of a transparent material, as in the shown embodiment where the lateral electrode 1212 comprises indium titanium oxide (ITO), instead of a standard metallic contact.

Figure 14:
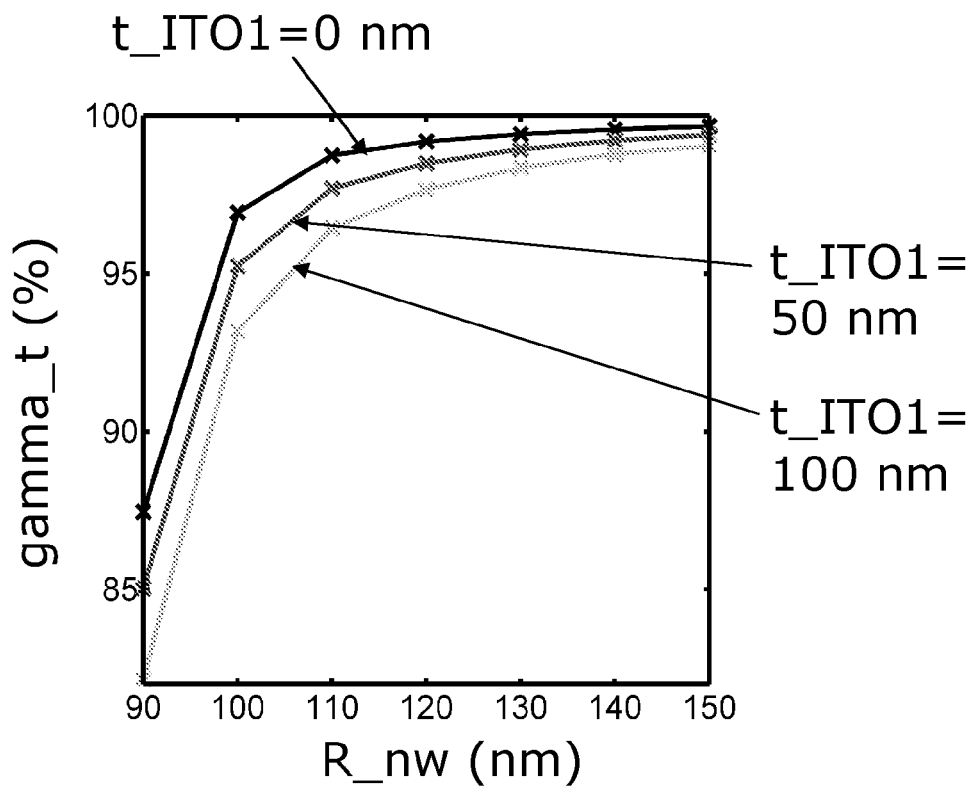
FIG. 14 is a graph showing the transmission of the fundamental guided mode as a function of the radius of the nanowire.

FIG. 14 is a graph showing the transmission gamma_t of HE11 through a lateral contact section as a function of the radius, R_nw, of the nanowire, such as a nanowire and lateral contact as shown in FIG. 13. The graph is based on calculations for a particular embodiment where the material of the lateral electrode is indium titanium oxide (ITO). The graph features three different curves showing the transmission gamma_t of HE11 through a lateral contact section as a function of the radius, R_nw, of the nanowire, each curve represents a different thickness, t_ITO1, of the lateral electrode, more particularly thicknesses of the indium titanium oxide (ITO) lateral electrode thicknesses t_ITO1 of 0 nm, 50 nm, and 100 nm. For the optimal radius R_nw=110 nm and for a 100 nm thick indium titanium oxide (ITO) layer, the transmission exceeds 95%. Even better transmissions are obtained for thinner indium titanium oxide (ITO) layers.

Figure 15:
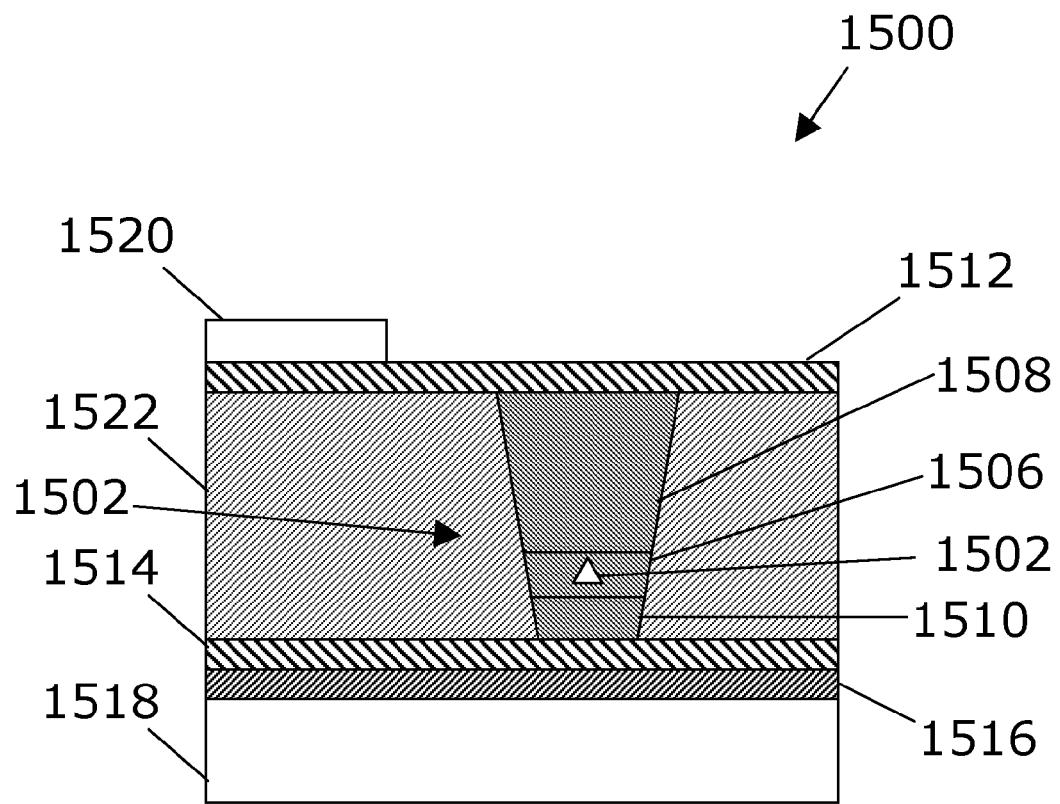
FIG. 15 shows another embodiment of the invention with a tapered nanowire where the nanowire has an effective diameter which is increasing towards the first end of the nanowire.

FIG. 15 shows another embodiment of the invention with a tapered nanowire where the nanowire has an effective diameter which is increasing towards the first end of the nanowire. This taper also allows an efficient refocusing of the far field emission of the wire. For a top facet with a diameter larger than 1.6 micrometer, corresponding to approximately 6*lambda/n_nw, where n_nw is the refractive index of the nanowire material, more than 95% of the light transmitted in air can be collected by a microscope objective with a numerical aperture given by NA=0.8.

A total tapering angle of 10° leads to a modal transmission of 97% inside the taper. These characteristics (top facet diameter and tapering angle) are compatible with realistic dimensions for the device (typically 10 micrometer height). A fraction of light in the guided HE11 mode is reflected back on the top facet, due to the refractive index contrast between GaAs and air. This reflection can be nearly perfectly suppressed using an antireflection coating (SiO_2, Si_3N_4, ITO, or other materials). A large top facet is a practical advantage for implementation of a top electrode. In the shown embodiment, an indium tin oxide (ITO) top electrode simultaneously ensures electrical contact to the nanowire and anti-reflection coating provided its thickness is well chosen. The thickness might favourably be chosen to be approximately lambda/(4n_ITO), where lambda is a wavelength of light and n_ITO is the refractive index of the top electrode. Notice, that although the top electrode material is indium tin oxide (ITO) in the present embodiment the top electrode might also comprise other materials, such as other transparent and electrically conducting materials. The figure further shows a single photon source 1500 comprising a nanowire 1502 which is tapered, the effective diameter of the wire is increasing towards the first end, which in the figure is the upper end of the nanowire 1502. Further shown is a first electrode comprising contact pad 1520 and a first indium tin oxide (ITO) layer 1512, and further a second electrode comprising a second indium tin oxide (ITO) layer 1514. The nanowire 1502 comprises a p-type zone 1508, an n-type zone 1510 and an intrinsic region 1506 wherein a photon emitter 1504 is embedded, the photon emitter being a quantum dot (QD) in the shown embodiment. The figure also shows a planarizing polymer 1522, a metallic layer 1516 which in the shown embodiment is gold, and a substrate 1518.

Figure 16:
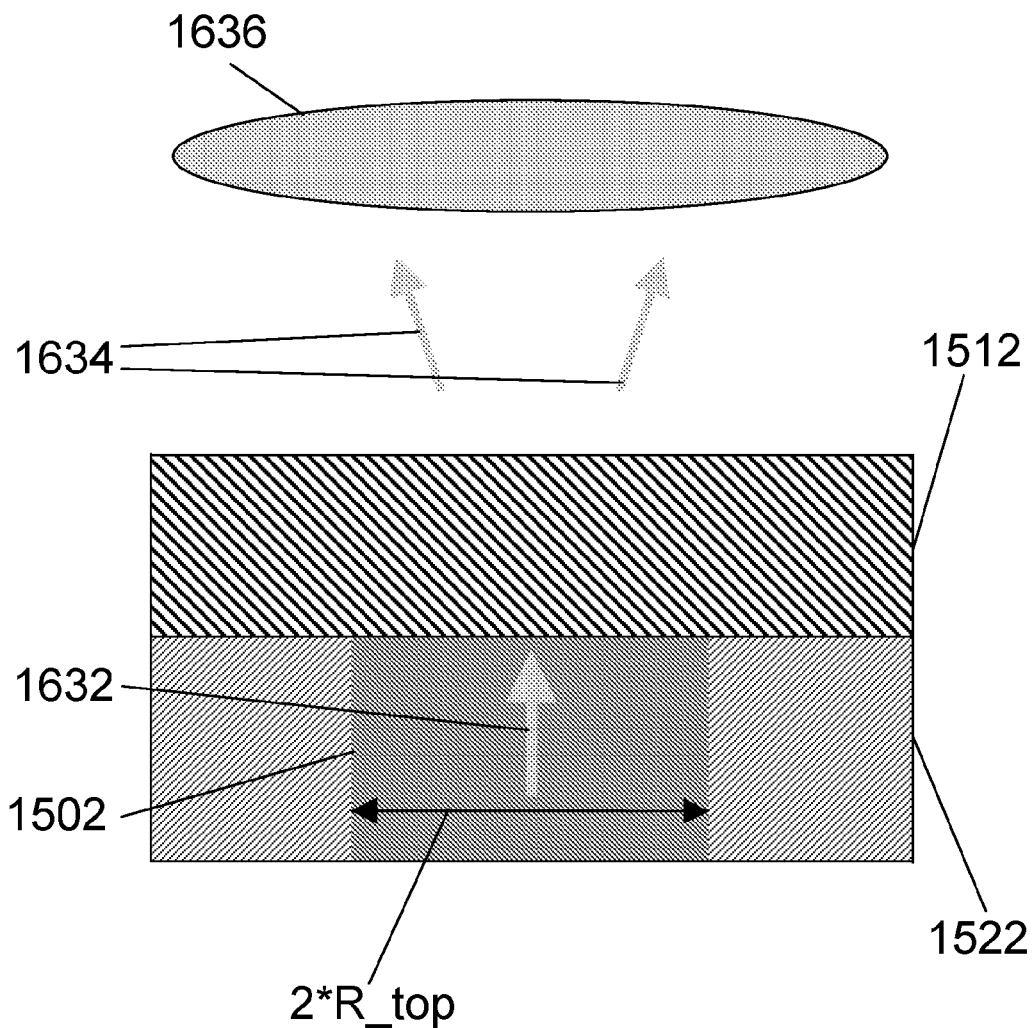
FIG. 16 shows a schematic illustration of a first end of a nanowire, a planarizing polymer, and an anti-reflection coating.

FIG. 16 shows a schematic illustration of a first end of a nanowire 1502, a planarizing polymer 1522, and an anti-reflection coating 1512, which in the shown embodiment simultaneously plays the role of an electrode. The illustration might be similar to a part of the illustration in FIG. 15, but it might also be representative for other embodiments of the invention. The nanowire 1502 has an effective diameter given by 2*R_nw. A first arrow 1632 indicates a direction of travelling of a single photon travelling in a direction towards the first end of the nanowire 1502. Second arrows 1634 indicate possible directions of travelling of a single photon which is emitted from the single photon source. The figure further shows a lens 1636 with a numerical aperture NA. Specifically, in the shown embodiment, the material of the anti-reflection coating 1512 may be indium tin oxide (ITO), however, it might also be other similar materials, such as other materials which are optically transparent and electrically conducting.

Figure 17:
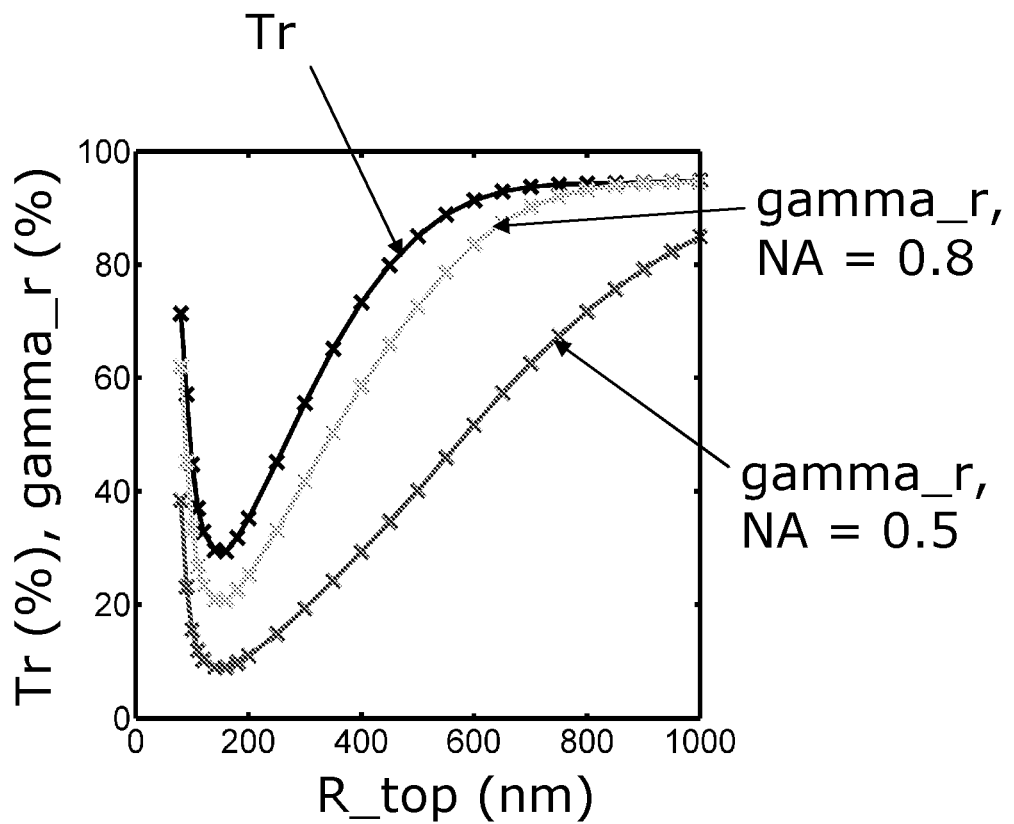
FIG. 17 is a graph showing total transmission and relative collection efficiency as function of an effective radius of the top of the nanowire.

FIG. 17 is a graph showing total transmission Tr and relative collection efficiency gamma_r for lenses with numerical aperture NA=0.5 and NA=0.8, respectively, as function of an effective radius, R_top, of the top of the nanowire, such as for a nanowire, planarizing polymer, anti-reflection coating and lens as depicted in FIG. 16. This corresponds to transmission in a solid angle corresponding to a solid angle which is covered by a lens having a numerical aperture NA=0.5 and NA=0.8, respectively. For a top radius exceeding 0.8 micrometer, all the light emitted by the structure is collected by a microscope objective, such as a lens, with numerical aperture NA=0.8. The maximum value of the transmission remains however slightly below 100% because of the absorption by free carriers in indium titanium oxide (ITO).

Figure 18:
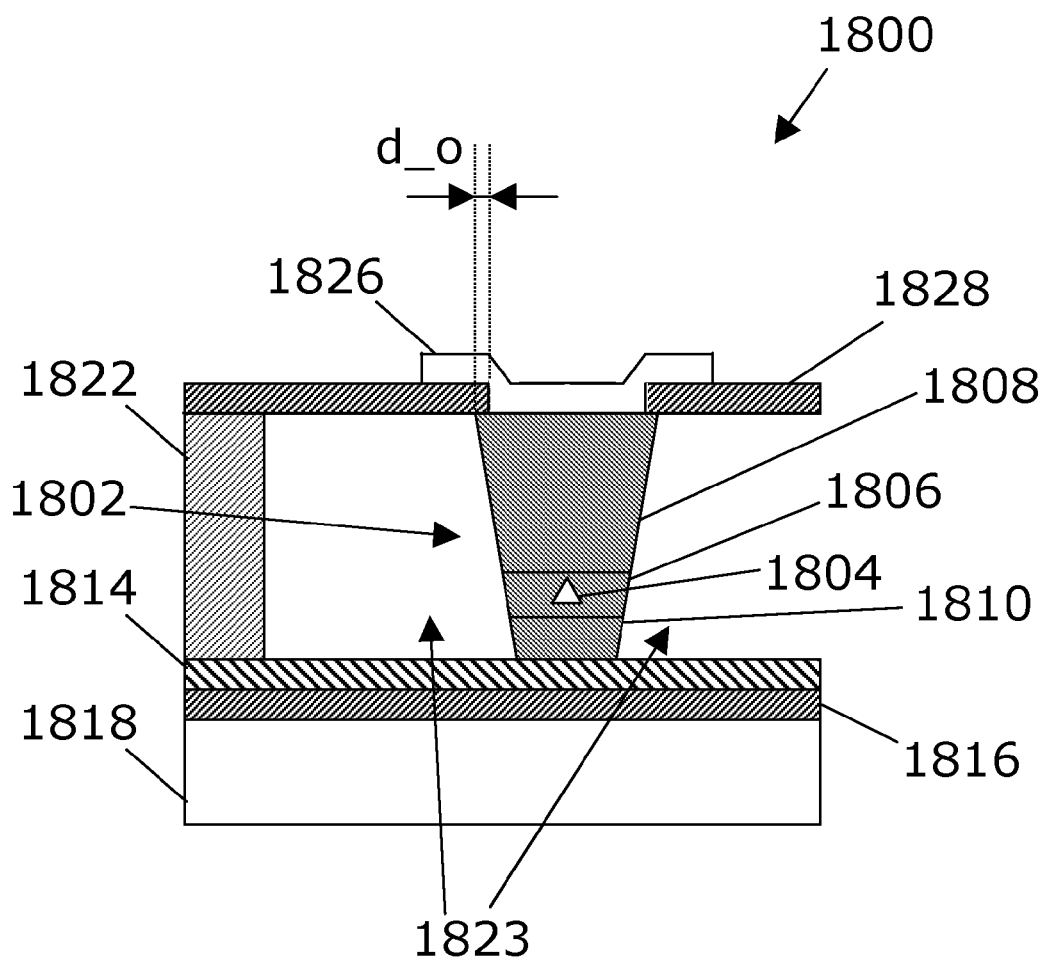
FIG. 18 shows another embodiment of the invention with a tapered nanowire where the nanowire has an effective diameter which is increasing towards the first end of the nanowire.

FIG. 18 shows another embodiment of the invention with a tapered nanowire 1802 where the nanowire has an effective diameter which is increasing towards the first end of the nanowire, in the figure the first end is in the upper end. The shown embodiment has an annular metallic top contact 1828, such as an annular gold top contact. Furthermore, the electrode is suspended so that the nanowire 1802 is encircled by air or vacuum 1823. This enables the utilization of the GaAs-air refractive index contrast to obtain a high value for beta (95%). Further shown is a single photon source 1800, which comprises a tapered nanowire 1802, where the effective diameter of the wire is increasing towards the first end. The annular gold metallic contact 1828 further functions as a contact pad. Further shown is an anti-reflection coating 1826 which might be indium tin oxide (ITO), however, it need not be conducting, as the electrical connection to the nanowire is carried out by the metallic top contact 1828, so the anti-reflection coating 1826 might also be a non-conducting material, such as silicon dioxide ($SiO_2$). Further shown is a second electrode comprising a second indium tin oxide (ITO) layer 1814. The nanowire 1802 comprises a p-type zone 1808, an n-type zone 1810 and an intrinsic region 1806 wherein a photon emitter 1804 is embedded, the photon emitter being a quantum dot (QD) in the shown embodiment. The figure also shows a planarizing polymer 1822, a metallic layer 1816 which in the shown embodiment is gold, and a substrate 1818. In the shown embodiment, the contact is provided by a ring-shaped electrode 1828 presenting a lateral overlap d_o with the top facet of the nanowire 1802. The remaining part of the top facet is covered by a non-conducting anti-reflection coating 1826 in order to limit optical absorption. For a ring contact with d_o<100 nm, the transmission in a solid angle corresponding to a solid angle which is covered by a lens having a numerical aperture NA=0.8 exceeds 95% for a top facet radius, R_top, larger than 0.9 micrometer. For a smaller radius, the amplitude of the mode HE11 at electrode position increases, leading to uncontrolled light scattering and to a spoiling of the transmission. Note that the impact of this top electrode 1828 can be further reduced, such as reduced by using a smaller contact area, such as a half ring shape electrode, or such as an even smaller structure. The use of smaller contact area is feasible since the current required to electrically pump a single quantum dot (QD) is low.

Figure 19:
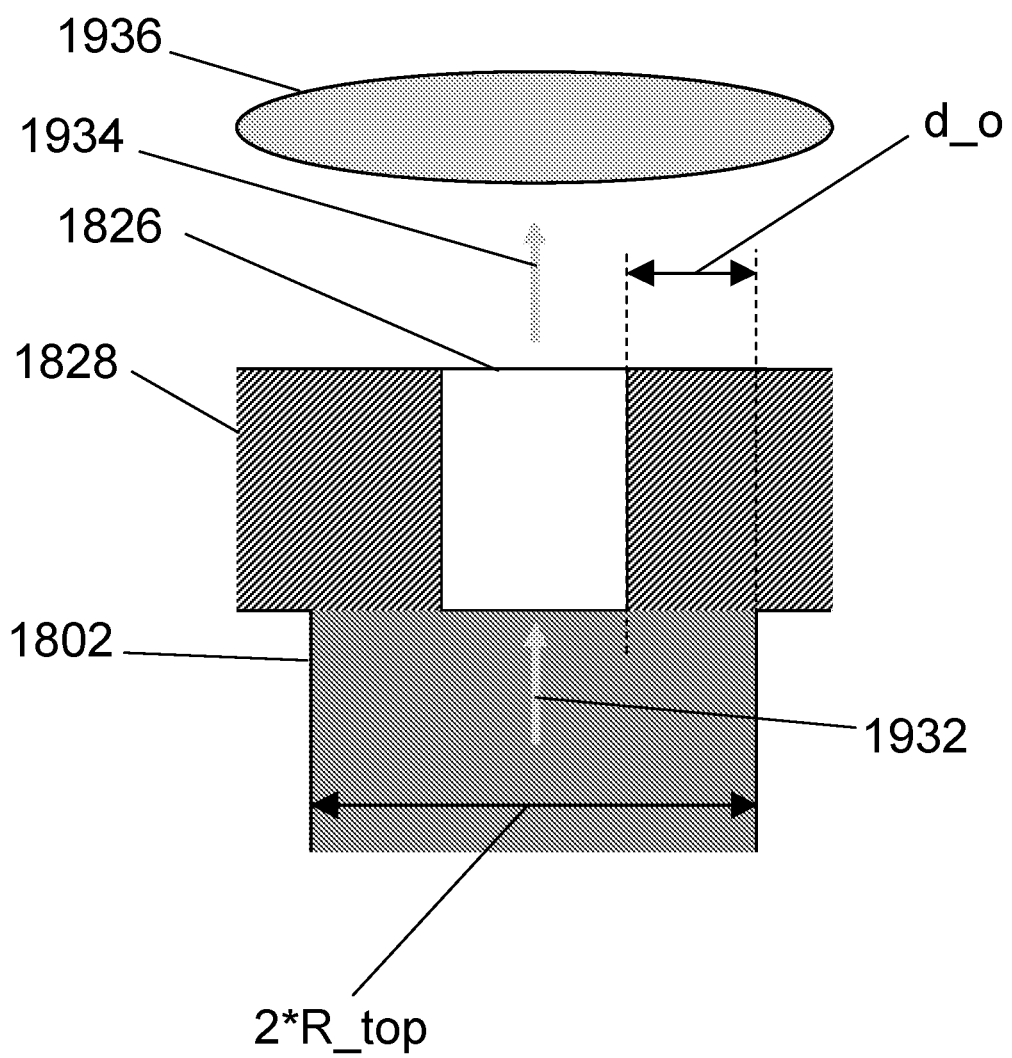
FIG. 19 shows a schematic illustration of a first end of a nanowire, a planarizing polymer, an annular gold top contact, and an anti-reflection element.

FIG. 19 shows a schematic illustration of a first end of a nanowire 1802, an annular metallic top contact 1828, such as an annular gold top contact, and an anti-reflection element 1826. The illustration might be similar to a part of the illustration in FIG. 18, but it might also be representative for other embodiments of the invention. The nanowire 1802 has an effective diameter given by 2*R_top. A first arrow 1932 indicates a direction of travelling of a single photon travelling in the nanowire 1802 towards the first end of the nanowire, which in the figure is the upper end. Another arrow 1934 shows a possible direction of travelling of a photon which is emitted out of the nanowire 1802 through the anti-reflection coating 1826. The distance of the overlap between an outer edge of the nanowire and an inner edge of the annular contact is denoted by d_o. In the shown embodiment, this distance is d_o=100 nm and the material of the annular contact 1828 might be gold, however, it is understood that it might also be similar materials, such as other conducting materials, such as silver, copper or others.

Figure 20:
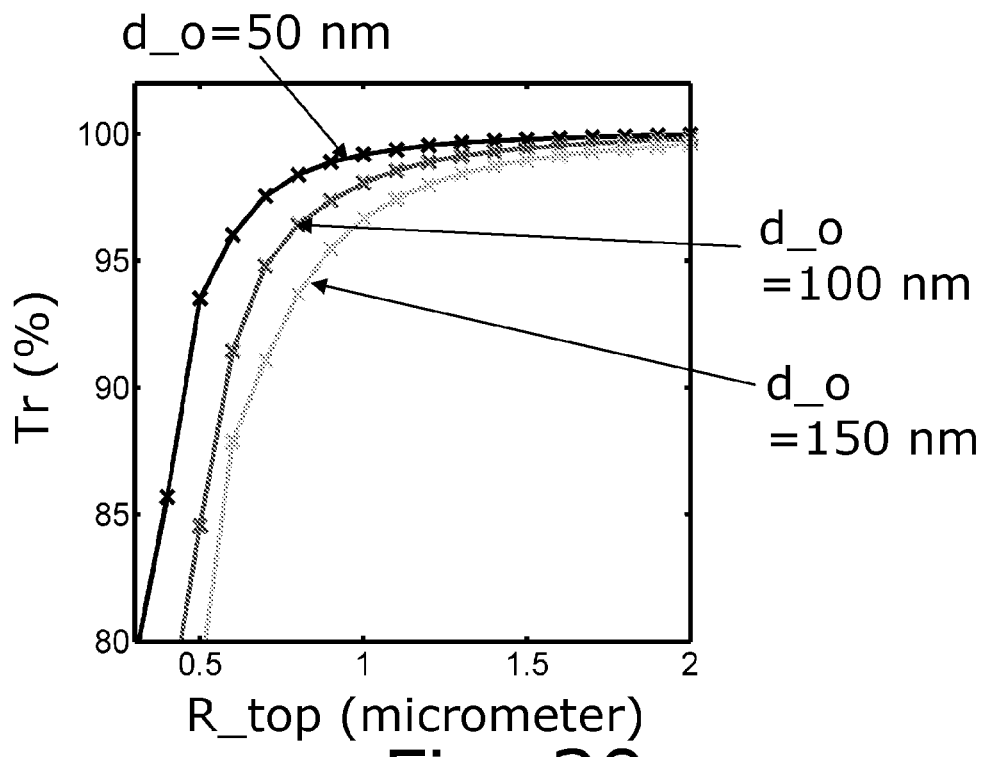
FIG. 20 shows a total transmission as function of top nanowire radius for different values of overlap distance.

FIG. 20 shows a total transmission Tr as function of top nanowire radius, R_top, for different values of overlap distance d_o, more specifically for overlap distances d_o=50 nm, 100 nm, and 150 nm. An illustration where the top nanowire radius, R_top, and overlap distance, d_o, are shown, is given by FIG. 19.

Figure 21:
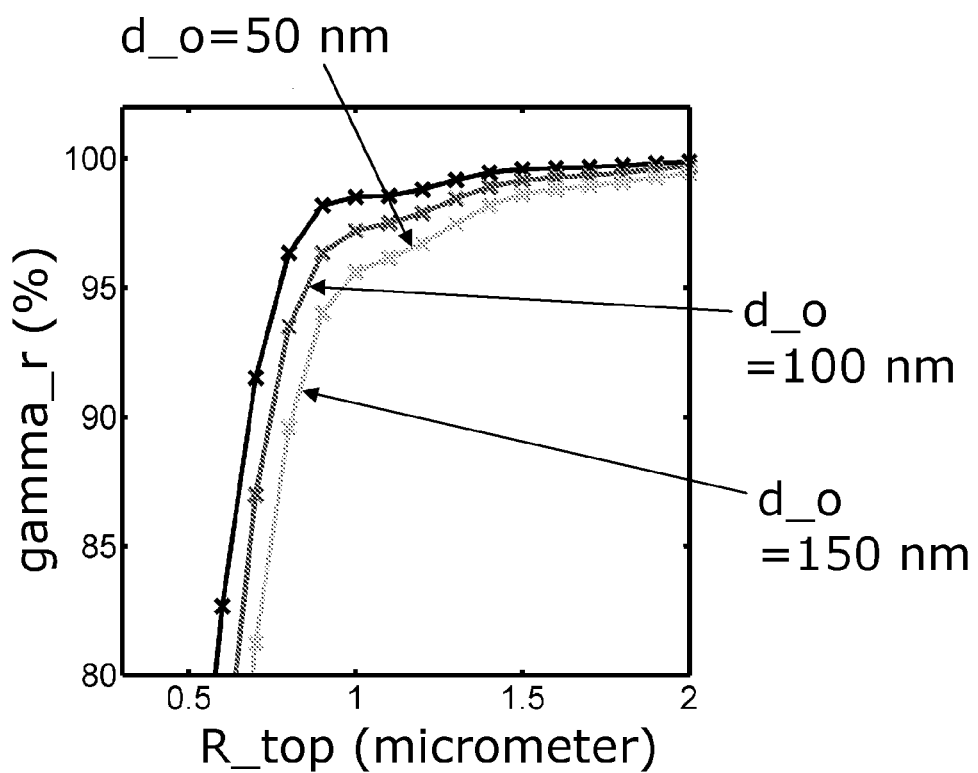
FIG. 21 shows a collection efficiency as function of top nanowire radius for different values of overlap distance.

FIG. 21 shows a collection efficiency gamma_r for a lens with numerical aperture NA=0.8 as function of top nanowire radius, R_top, for different values of overlap distance d_o, more specifically for overlap distances d_o=50 nm, 100 nm, and 150 nm. An illustration where the top nanowire radius, R_top, and overlap distance, d_o, are shown, is given by FIG. 19.

Figures 22, 22A, 22B:
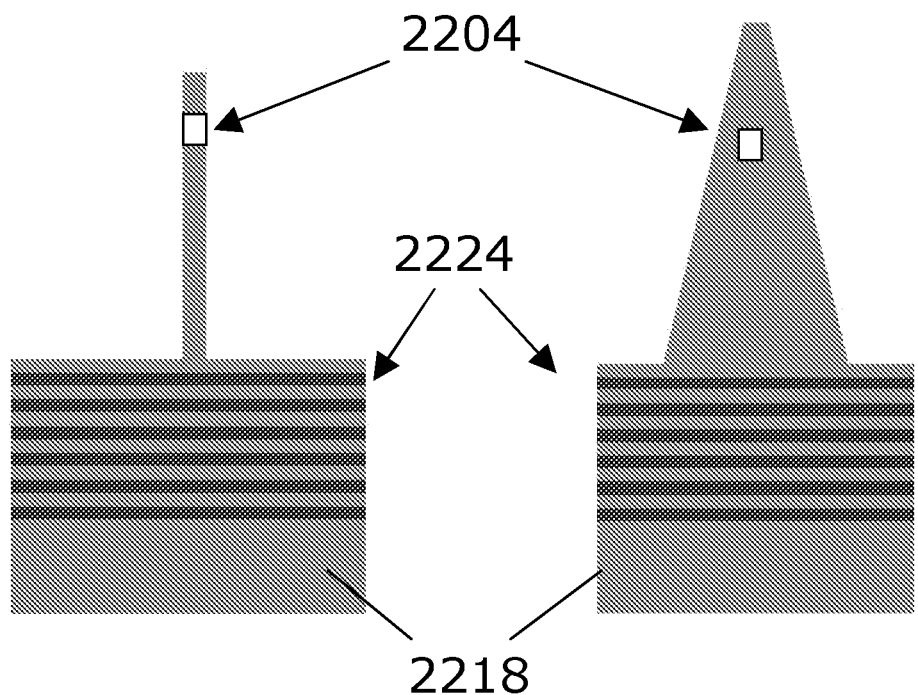
FIG. 22 shows an embodiment of the invention during steps of a method of manufacture.

FIG. 22 shows an embodiment of the invention during steps of a method of manufacture. Particularly, the figure shows steps of a method of manufacture of the embodiment shown in FIG. 11. The reference signs represent photon emitter 2204, distributed Bragg reflector (dBr) 2224, and substrate 2218.

In order to fabricate an embodiment of the invention, there is suggested a method comprising growing a planar structure, such as growing a planar structure by molecular beam epitaxy, comprising an array of self-assembled photon emitters, such as quantum dots, such as InAs quantum dots, such as quantum dots grown in the Stranski-Krastanov mode and buried in GaAs, such as flat dots presenting an in-plane dipole moment. The planar structure might be a layer comprising GaAs. The planar structure might be positioned adjacent to a sacrificial layer, such as a layer of Al0.8Ga0.2As, such as a layer of thickness of approximately 500 nm. The sacrificial layer is connected to a growth wafer. The method further comprises placing an intermediate material, such as a transparent layer, such as an electrically conducting layer, such as an indium tin oxide (ITO) layer, of a thickness of approximately 13 nm, onto a second end the planar structure. Notice that although indium tin oxide might be used, it might also be possible to use other materials. In terms of thickness of said intermediate layer, in general this might favourably be dimensioned to 0.024 lambda/n, where lambda is a wavelength of light, and n is the refractive index of the intermediate layer. The method further comprises placing a material, such as an optically reflective layer, such as a gold layer of a thickness of approximately 250 nm, onto the intermediate material. A flip-chip step of the planar structure is performed. Firstly, the second end of the sample is connected, such as glued with epoxy glue, onto a host substrate, such as a host wafer, such as a GaAs host wafer. The growth wafer is then removed, first mechanically, then by a chemical process, such as selective wet etching. Finally, the sacrificial layer is removed by another, chemical process, such as selective wet etching, leaving a mirror flat surface. The nanowires are then defined, such as defined through a combination of e-beam lithography and reactive ion etching. The sample is then planarized, such as planarized with a polymer. In the embodiments shown in FIGS. 1, 12, 15, 18, the photonic wires are defined by dry etching. Their fabrication processes share the same first steps. The embodiment shown in FIG. 11 features a planar distributed Bragg reflector grown by molecular beam epitaxy. In a specific method of manufacture, the growth of the nanowire over the distributed Bragg reflector structure can be catalysed using gold particles with a small diameter, such as below 100 nm. The first step consists of the vertical growth of a nanowire featuring a longitudinal heterostructure, defining a quantum dot as depicted in FIG. 22(a). A subsequent lateral overgrowth enlarges the wire diameter, to provide an efficient light waveguiding as depicted in FIG. 22(b). The remainder of the process, which implements the electrical contact, is similar to the process leading to the embodiment depicted in FIG. 1.

For the embodiments shown in FIGS. 1 and 15, the top electrode, such as the ITO electrode, can be directly deposited. In the case of the embodiment depicted in FIG. 12, the planarizer is partially etched, and a directive deposition of ITO is performed. Finally, a gold contact pad is deposited by a last lithography step.

For the embodiment shown in FIG. 18, a ring shaped electrode connected to a contact pad by a thin, such as below 1 micrometer, wire is deposited. An isotropic plasma etching removes the planarizing polymer under the contact wire and around the nanowire structure. Finally an anti-reflection coating, such as silica, is deposited.

The embodiment shown in FIG. 11, featuring a planar distributed Bragg reflector, is more adapted to a bottom-up fabrication of the nanowire structure. The growth of the nanowire consists of 2 steps. First, a small diameter (<100 nm) wire is grown. A longitudinal heterostructure defines the quantum dot (QD), see FIG. 22(a). A subsequent lateral overgrowth enlarges the wire diameter, to provide an efficient light waveguiding, see FIG. 22(b).

Figure 23:
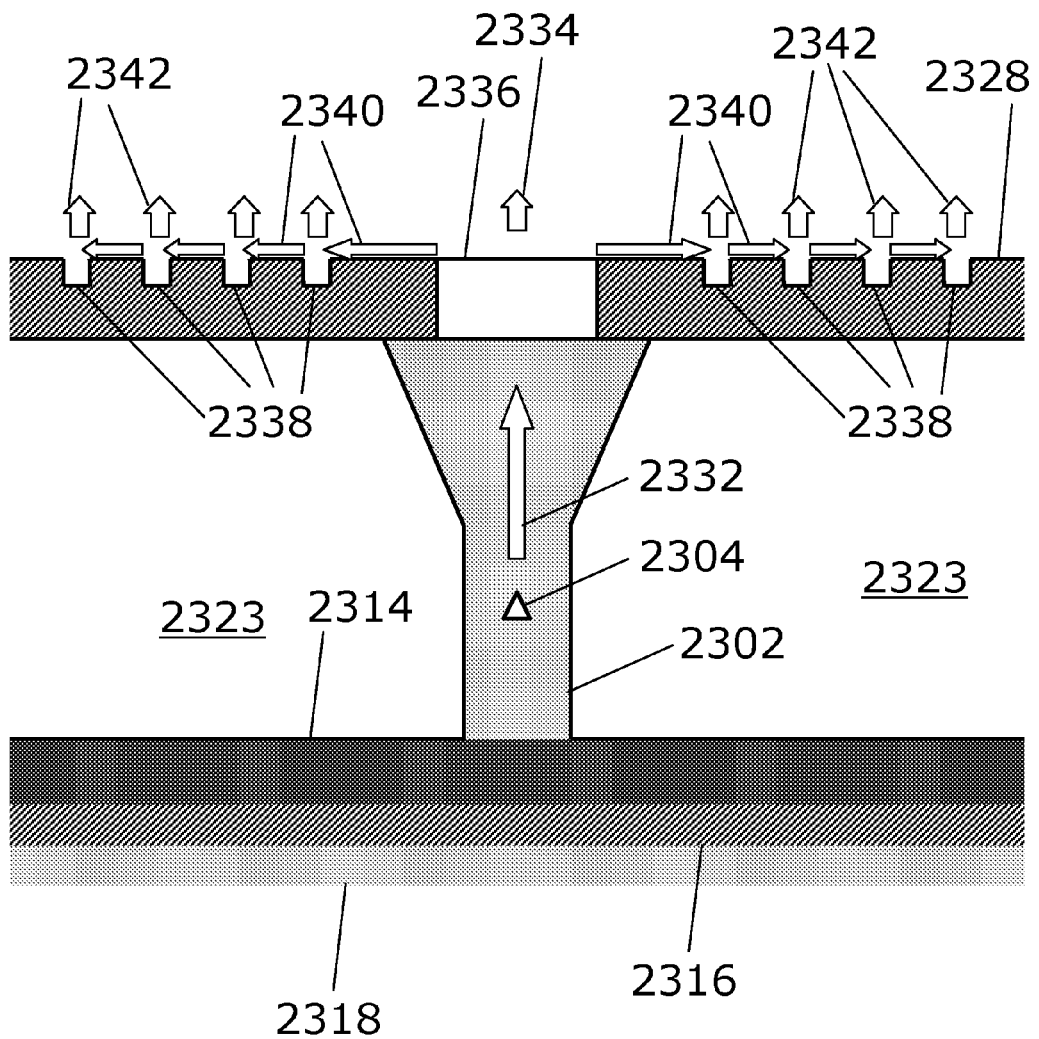
FIG. 23 shows a specific embodiment where the beam divergence is reduced using a plasmonic collimator.

FIG. 23 shows a specific embodiment where the beam divergence is reduced using a plasmonic collimator. In the figure a nanowire single photon source with a plasmonic collimator. Specifically, the figure shows a nanowire 2302 with a photon emitter 2304. Furthermore is shown a second ITO layer 2314 at the bottom, a bottom metallic layer 2316 which may in some embodiments be a bottom gold layer, substrate 2318 which may in some embodiments be a GaAs substrate, air 2323 encircling the nanowire, a transparent layer 2326 which may in some embodiments be a silicon nitride layer, such as a Si_4N4 layer, an annular metallic electrode 2328 which may in some embodiments be an annular gold electrode, an arrow 2332 indicating a direction of a photon inside the nanowire 2302 travelling towards first end, an arrow 2332 indicating a direction of a photon travelling outside nanowire 2302, grooves 2338, arrows 2340 indicate a position and direction of surface plasmons travelling along a surface of the annular metallic electrode 2328, arrows 2342 indicating a direction of photons emitted from the surface of the annular metallic electrode.

A central feature of the nanowire single photon source design is a low-divergence output beam which allows for efficient coupling to the collection optics. In the designs, the output beam profile is controlled using the tapering sections. However, another possible approach for controlling the output beam profile is the implementation of a plasmonic collimator. The two approaches are not mutually exclusive, designs can be imagined which incorporates only tapering sections (corresponding to the designs shown in FIGS. 1, 5, 8, 11-12, 15, 18 and 22), only the plasmonic collimator or a combination of both. A design with such a combination is illustrated in FIG. 23, which shows a side view of a single photon source design incorporating a plasmonic collimator. Grooves 2338 are etched into the annular metallic electrode, the metallic electrode being a gold layer in the shown embodiment. Arrows 2332, 2340, 2342 indicate light propagation.

The plasmonic collimator is obtained by implementing a grating structure on the surface of the gold layer. Experimentally this can easily be achieved, either by etching into the gold contact layer to obtain grating grooves 2338 or by deposition to obtain gold strips (cf. metallic strips 2439, FIG. 24). The grating may be circularly symmetric. An advantage of having a circularly symmetric grating may be that it ensures beam shaping in both lateral directions. Such circularly symmetric grating is illustrated in FIG. 25.

Figure 24:
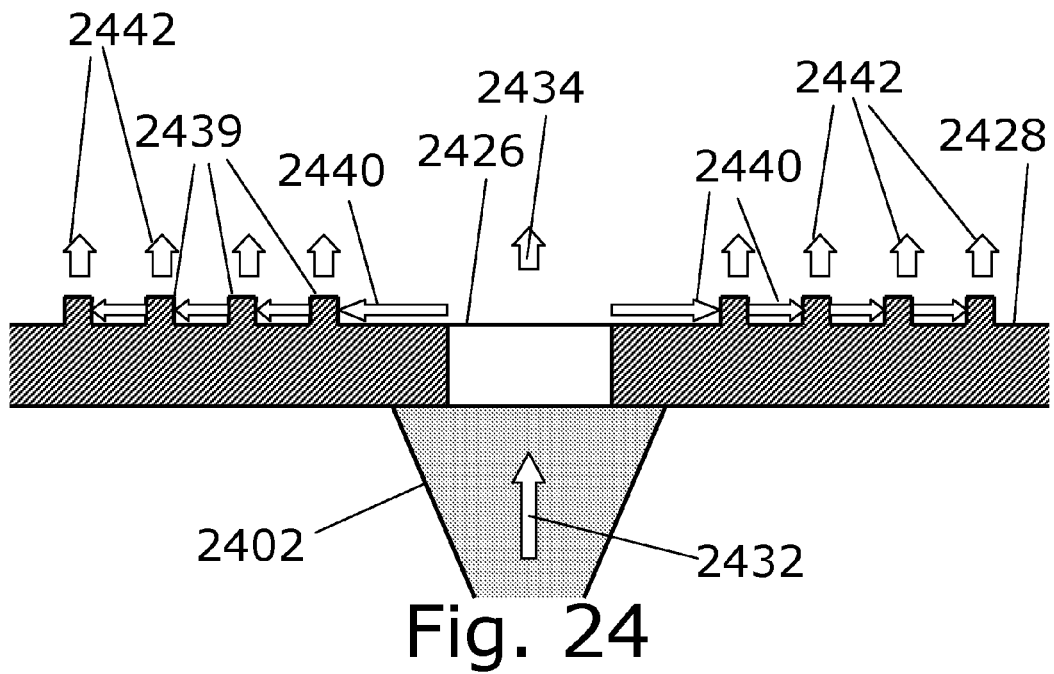
FIG. 24 shows a side view of a top part of a single photon source design incorporating a plasmonic collimator.

The collimator works by exploiting the coupling of to surface plasmons which occurs automatically when the diameter of the top part of the nanowire is small. Surface plasmons are light-matter waves localized to the surface of the metal-air interface. They are represented in FIGS. 23-24 by horizontal arrows 2340, 2440. Without the grating they propagate along the surface and represent a loss. However, the light carried by the surface plasmons can be scattered out into air by implementing a grating. The distance between the grating grooves could in some embodiments be an integer number of plasmonic wavelengths, such that the contributions from the different grooves are in phase and add up constructively. If this condition is fulfilled, the emitted light is conceptually generated by a series of sources in a plane which are in phase, and the resulting emission pattern is that of a low-divergence plane wave emitted from the surface.

FIG. 24 shows a side view of a top part of a single photon source design incorporating plasmonic collimator. Metallic strips 2439 are deposited on top of the contact layer, which in the shown embodiment is in the form of an annular metallic electrode 2428. In some embodiments, the annular metallic electrode is an annular gold electrode. The metallic strips 2439 may in some embodiments be gold strips. Furthermore, the figure shows a nanowire 2402, a transparent layer 2426 which may in some embodiments be a silicon nitride layer, such as a Si_4N4 layer, an arrow 2432 indicating a direction of a photon inside the nanowire 2402 travelling towards first end, an arrow 2432 indicating a direction of a photon travelling outside nanowire 2402, arrows 2340 indicate a position and direction of surface plasmons travelling along a surface of the annular metallic electrode 2428, arrows 2442 indicating a direction of photons emitted from the surface of the annular metallic electrode.

Figure 25:
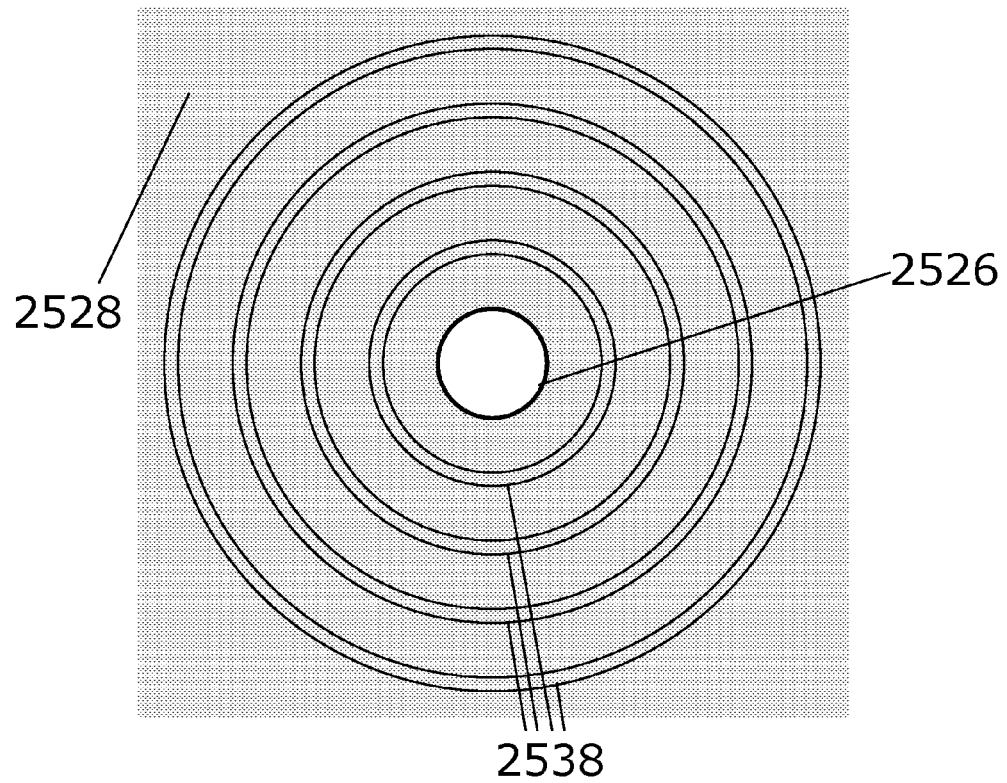
FIG. 25 shows top view of a single photon source design incorporating a plasmonic collimator.

FIG. 25 shows a top view of a single photon source design incorporating plasmonic collimator. The figure shows transparent layer 2526, annular metallic electrode 2528 and grooves 2538.

The circular plasmonic collimator has been described in an article entitled "Quantum cascade lasers with integrated plasmonic antenna-array collimators" by Yu et al. in Opt. Express 16, 19447 (2008), which is hereby incorporated by reference in its entirety. The article is hereinafter referred to as Yu et al. In Yu et al., the collimator is used to reduce the beam divergence of a ridge waveguide laser. Their design is illustrated in FIG. 1 of Yu et al.

The device considered in Yu et al. features horizontal emission. The output aperture is rectangular with a high aspect ratio leading to a divergent output beam in the absence of plasmonic grating with far field emission divergence angles of 30° to 70°. The grating is then etched into the side of the device to improve the output beam profile. Their simulations results are shown in FIG. 2(d) in Yu et al., which figure shows beam divergence angle as function of number of rings. It is understood that the word "ring" is used interchangeably with "groove" or "metallic strip".

The calculations show that far-field beam divergence is reduced to below 5° for 20 rings. For 10 rings the divergences are twice as large, and 20 rings should thus be obtained for optimal results.

The plasmonic collimator represents an alternative solution to the problem of controlling the beam shape. For use in a high-efficiency single photon source however, there is an efficiency issue that need to be addressed. The issue is outlined in Table I, which summarizes the measured divergence angle and power for the devices described in Yu et al., relative to that of the original lasers without plasmonic gratings.

TABLE I

| Device with 10 rings ||| Device with 20 rings |||
| --- | --- | --- | --- | --- | --- |
| Aperture size $w_1 \times w_2$ ($\mu m^2$) | FWHM far-field divergence angles $\theta_\perp, \theta_\parallel$ (degrees) | Maximum power compared to the original laser | Aperture size $w_1 \times w_2$ ($\mu m^2$) | FWHM far-field divergence angles $\theta_\perp, \theta_\parallel$ (degrees) | Maximum power compared to the original laser |
| 2.1 × 1.9 | 5.1, 8.6 | 18% | 2.8 × 1.9 | 2.7, 3.7 | 11% |
| 5.0 × 1.9 | 5.1, 9.2 | 33% | 5.0 × 1.9 | 2.7, 3.7 | 37% |
| 7.5 × 1.9 | 5.2, 10.1 | 45% | 8.1 × 1.9 | 2.4, 4.6 | 53% |
| 10.1 × 1.9 | 4.5, 11.4 | 56% | | | |

Figure 26:
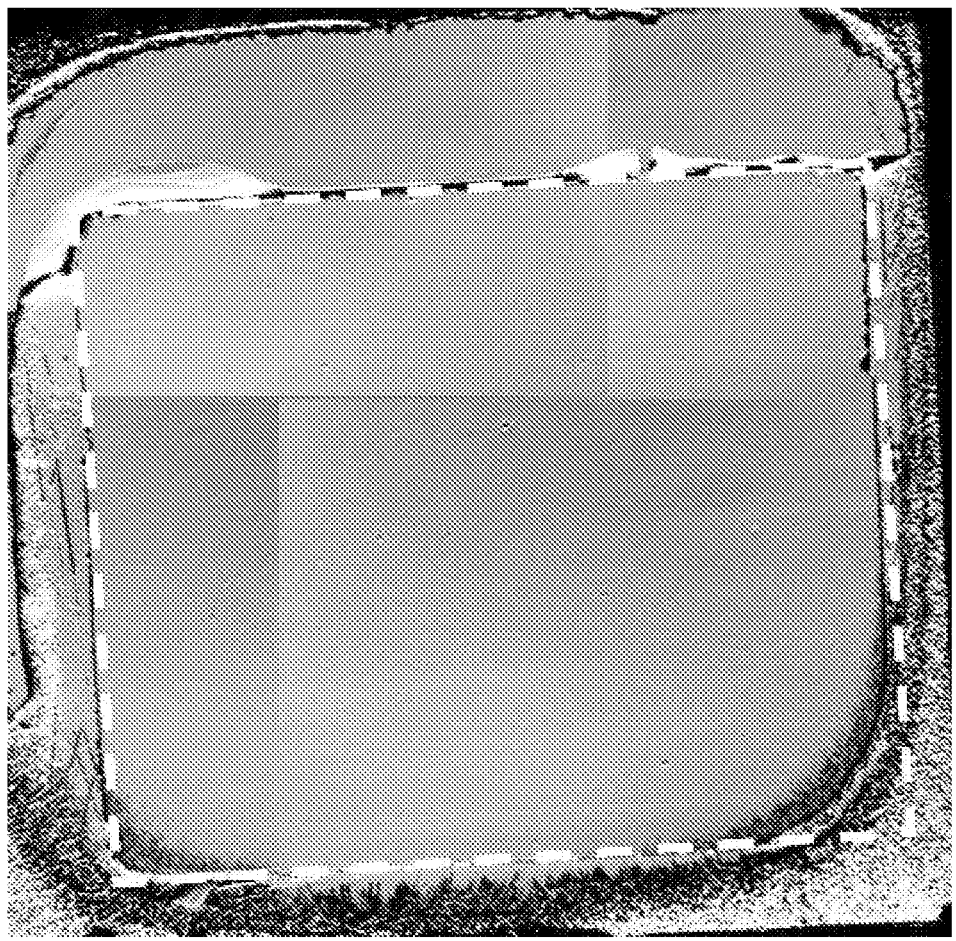
FIG. 26 shows a 12 micrometer thick GaAs membrane glued on a GaAs host substrate.

FIG. 26 shows a 12 micrometer thick GaAs membrane glued on a GaAs host substrate. On this optical microscope reconstructed view, no significant defects are present on a 5×5 mm² surface (dashed rectangle).

Figure 27B:
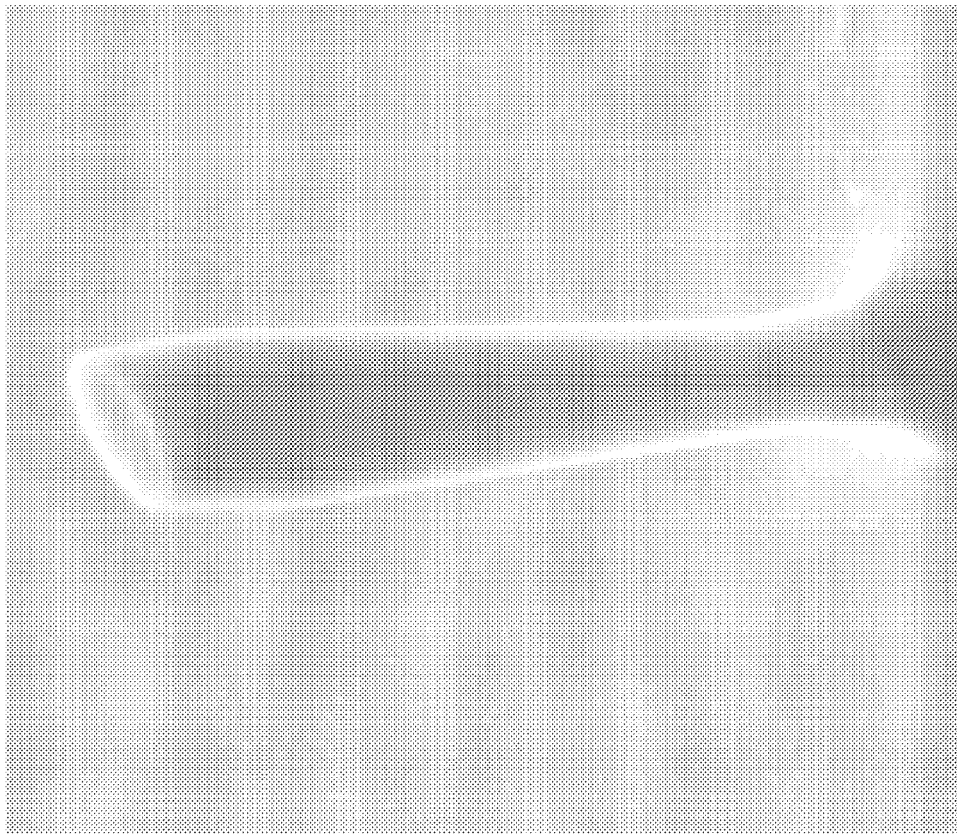
FIGS. 27A-B shows micropillars realized by deep etching of GaAs.
Figure 27A:
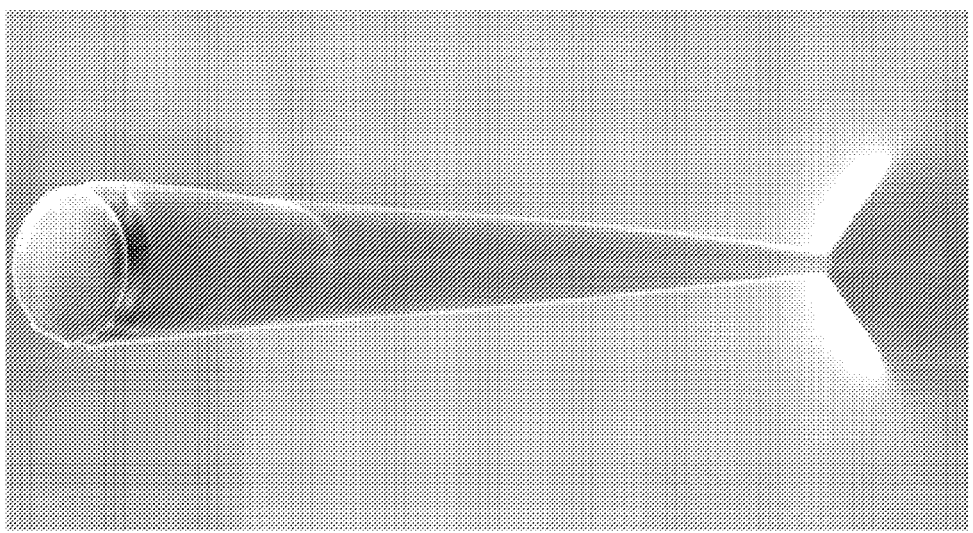

FIG. 27A shows an elliptical photonic wire for a control over the polarization of the emitted photons, where the dimensions are given as height 2 micrometer, large diameter 200 nm, and small diameter 100 nm.

FIG. 27B shows deep etching of GaAs, the total height is 12 micrometer and the top facet diameter is 1.8 micrometer, Fabrication In the following is provided an exemplary fabrication process for the design shown in FIG. 23, albeit without the plasmonic collimator.

Step 1—MBE Growth of a Planar Sample.

It is composed of a GaAs layer whose thickness is the total thickness of the wire. This layer contains an intrinsic layer (typical thickness 100-300 nm) surrounded by n-type and p-type GaAs. In the intrinsic layer lies an array of self-assembled InAs quantum dots. This GaAs structure lies over a sacrificial layer of Al0.8Ga0.2As (500 nm thickness). All the structure is grown on a GaAs wafer.

Step 2—Deposition of the Mirror: Gold and ITO.

ITO (or an equivalent conductive glass) and Au are deposited on top of the sample.

Step 3—Flip-Chip Process.

The sample is then glued (Au side) on an host substrate with an epoxy glue (e.g. M-Bond™). The growth wafer is then removed first by mechanical abrasion, in order that 50-100 μm of the growth substrate remains. A wet etching (selective with respect to the Al0.8Ga0.2As sacrificial layer) removes the remaining GaAs; the etching stops at the Al0.8Ga0.2As layer. The Al0.8Ga0.2As layer is removed with another chemical (HF) selectively with respect to GaAs. In the end of this process, one is left with the p-i-n GaAs/ITO/Au structure glued on the host substrate. As a demonstration of feasibility, FIG. 26 shows a GaAs membrane glued on an GaAs host wafer using this process.

Step 4—Definition of the Wires: Lithography and Dry Etching.

An e-beam lithography step, followed by the deposition of a metal and a lift-off defines a hard mask. It is composed of disks that will define the top facet of the structure. This step is followed by a dry etching using a Reactive Ion Etch (RIE) or Inductively Coupled Plasma (ICP) etching plasma system. FIG. 27 shows the result of a deep etching realized in an Oxford RIE chamber (PlasmaLab® 100) using a SiCl_4-Ar gas chemistry. A controlled under-etching is used to realize the inverted taper. After the etching, the mask is removed.

Step 5—Planarization.

The structure is the planarized by spin-coating and baking a polymer planarizer (e.g. Accuflo® sold by the company 'Honeywell'). This kind of approach has already been used to planarize AlGaAs micropillar samples, as described in Appl. Phys. Lett. 92, 091107 (2008) which is hereby incorporated by reference in its entirety.

Step 6—Deposition of the ITO Top Contact.

ITO (or an equivalent conductive glass) is deposited on the structure.

Step 7—Deposition of the Top Contact Electrode.

A last lithography step allows the definition of gold pads for the top electrical contact.

Modelling

Figure 29C:
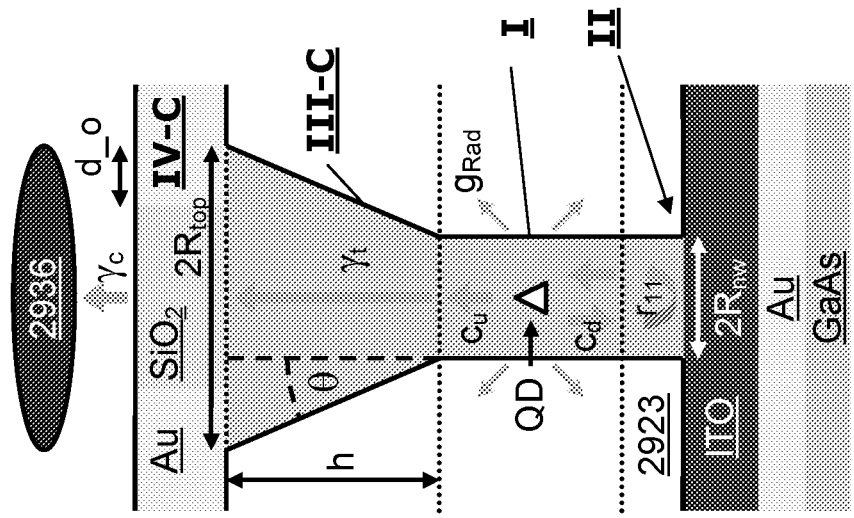
Figure 29B:
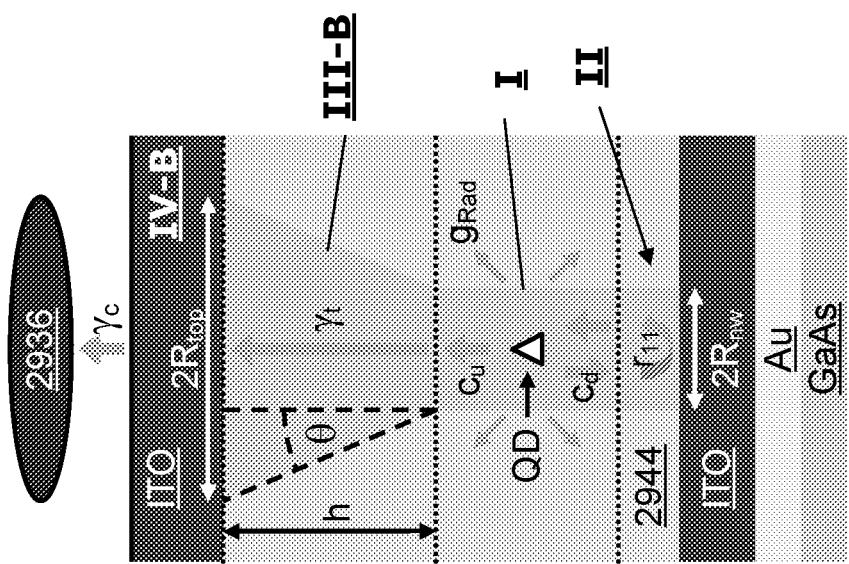
Figure 29A:
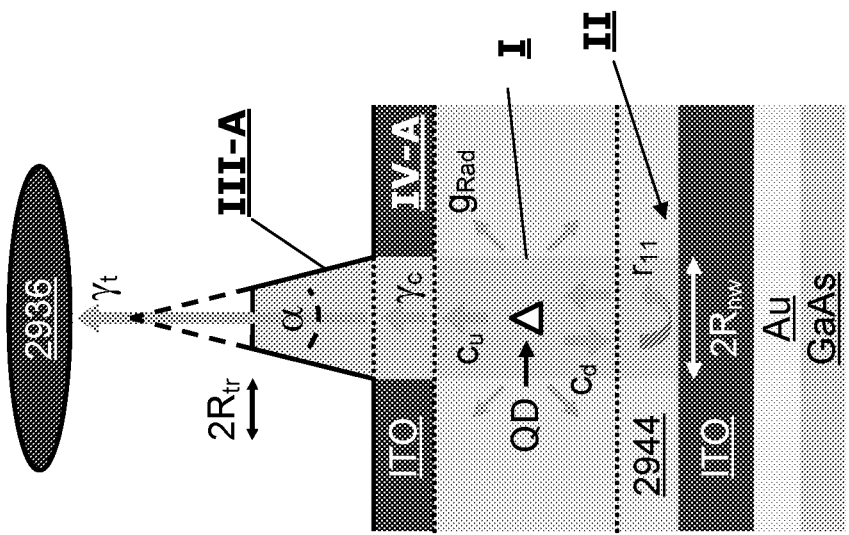

The performance of three possible electrically pumped SPS designs has been investigated using numerical simulations. The designs are illustrated in FIGS. 29A-C, where the design in FIG. 29A features a top conical tapering and the designs in FIGS. 29B-C features inverted tapering and anti-reflection coatings. The design in FIG. 29B features a planar ITO top contact while the design in FIG. 29C includes a gold Au ring contact and an air 2923 pocket.

The design schematically illustrated in FIG. 29A features a nanowire with a photon emitter being an embedded quantum dot QD, a bottom metal mirror of gold Au and a regular conical tapering section for the extraction of photons. Furthermore, the designs schematically illustrated in FIGS. 29B-C feature an inverted conical tapering and a planar top contact compatible with existing micropillar contact processing techniques. Also shown is a lens 2936 and a polymer 2944.

The design schematically illustrated in FIG. 29B features a planar top ITO contact whereas the design schematically illustrated in FIG. 29C incorporates a gold (Au) annular ring contact and an air 2923 pocket.

2*R_tr corresponds to 2*R_trunc as shown in FIG. 5, GaAs corresponds to the layer material being Gallium Arsenide, h corresponds to a height of the tapering section. In the design depicted in FIG. 29A, hereinafter referred to as design A, gamma_t corresponds to the power collected by the lens 2936 relative to that of the guided mode at the interface between sections III-A and IV-A. In the designs depicted in FIGS. 29B-C, hereinafter referred to respectively as design B and design C, gamma_t corresponds to the transmission coefficient of the fundamental mode in the taper sections III-B and III-C. III-A corresponds to the top section of design A featuring a regular truncated tapering of the nanowire. IV-A corresponds to the contact section of design A featuring a contact ring surrounding the nanowire. C_u corresponds to the power carried by the upwards propagating guided mode. C_d corresponds to the power carried by the downwards propagating guided mode. g_rad corresponds to the spontaneous emission rate into radiation modes. I corresponds to central nanowire section containing a quantum emitter inside a nanowire. The nanowire is surrounded by a material with a lower refractive index. II corresponds to the bottom metal mirror section employed to reflect light emitted downwards back towards the top. IV-B corresponds to the uniform top contact layer of design B serving simultaneously as an electrical contact and an optical anti-reflection coating. III-B corresponds to the inverted tapering section of design B, inside which the optical mode profile is adiabatically expanded. IV-C corresponds to the top contact section of design C consisting of a central anti-reflection coating surrounded by an annular ring metal contact, in the depicted example being a gold Au contact. III-C corresponds to the inverted tapering section of design C, inside which the optical mode profile is adiabatically expanded. In design A gamma_c corresponds to the transmission coefficient of the fundamental mode in the contact section IV-A. In designs B and C, gamma_c corresponds to the power collected by the lens relative to that of the guided mode at the interface between sections III-B/C and IV-B/C. r_11 corresponds to the reflection coefficient of the optical mode at the metal mirror in section II.

The performance of the three electrically pumped single photon source designs schematically illustrated in FIG. 29 has been investigated using numerical simulations.

The predicted efficiencies as function of opening angle alpha (α) for the design in FIG. 29A and top radius R_top for the designs in FIGS. 29B-C for a realistic set of geometrical parameters is shown in FIG. 28. Calculations from both a simplified single-mode model and exact computations are shown. The agreement is good and the small deviations are well understood. The simulations predict a maximum efficiency of ~81% for the designs in FIGS. 29A-B and ~89% for design in FIG. 29C. The improved efficiency for design C is due to the introduction of the air 2923 pocket which increases the coupling between the quantum dot QD and the fundamental nanowire mode and due to the almost ideal Si3N4 anti-reflection coating resulting in a one-dimensional (1D) transmission coefficient of 99.7% from the nanowire into air.

Figure 28A:
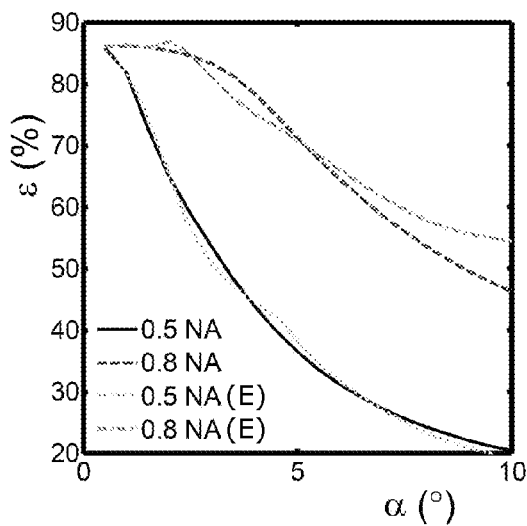
FIGS. 28A-C show single photon source efficiency epsilon (∈) for the three specific designs schematically illustrated in FIGS. 29A-C, FIGS. 29A-C schematically illustrates three specific single photon source designs.
Figure 28B:
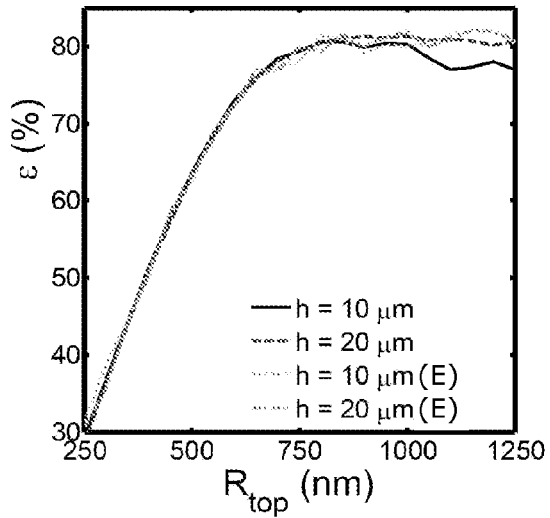
Figure 28C:
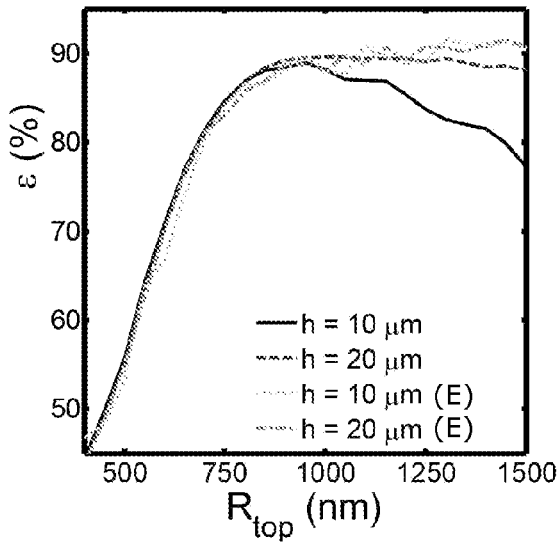

FIGS. 28A-C show single photon source efficiency epsilon (∈) for the three specific designs schematically illustrated in FIGS. 29A-C. Results from the simplified model and the exact computation are shown, with the 'Exact' curves marked in the legend with an '(E)'.

FIG. 28A shows single photon source efficiency epsilon (∈) for the design schematically illustrated in FIG. 29A as function of opening angle alpha (α) for 0.5 and 0.8 NA lenses.

FIG. 28B shows single photon source efficiency epsilon (∈) for the design schematically illustrated in FIG. 29B as function of R_top for a 0.8 NA lens.

FIG. 28C shows single photon source efficiency epsilon (∈) for the design schematically illustrated in FIG. 29C as function of R_top for a 0.8 NA lens. To sum up, the present invention relates to a single photon source 1800 comprising a tapered nanowire 1802, where the nanowire 1802 is made of a semiconductor material, a first electrode 1828 and second electrode 1814, where the electrodes are electrically coupled to a photon emitter 1804 embedded in the nanowire 1802 and wherein the photon emitter 1804 is capable of emitting a single photon when an activation voltage is applied between the electrodes. In advantageous embodiments of the invention, the nanowire is encircled by air, such that advantage can be taken of the resultant large ratio between a refractive index of the nanowire and the encircling material, air. Another advantageous feature might be that the first and second electrodes are optically transparent, such that they can be used as part of a reflective element or anti-reflective element.

Although the present invention has been described in connection with preferred embodiments, it is not intended to be limited to the specific form set forth herein. Rather, the scope of the present invention is limited only by the accompanying claims.

In this section, certain specific details of the disclosed embodiment are set forth for purposes of explanation rather than limitation, so as to provide a clear and thorough understanding of the present invention. However, it should be understood readily by those skilled in this art, that the present invention may be practiced in other embodiments which do not conform exactly to the details set forth herein, without departing significantly from the spirit and scope of this disclosure. Further, in this context, and for the purposes of brevity and clarity, detailed descriptions of well-known apparatus, circuits and methodology have been omitted so as to avoid unnecessary detail and possible confusion. In the claims, the term "comprising" does not exclude the presence of other elements or steps. Additionally, although individual features may be included in different claims, these may possibly be advantageously combined, and the inclusion in different claims does not imply that a combination of features is not feasible and/or advantageous. In addition, singular references do not exclude a plurality. Thus, references to "a", "an", "first", "second" etc. do not preclude a plurality. Reference signs are included in the claims however the inclusion of the reference signs is only for clarity reasons and should not be construed as limiting the scope of the claims.

SELECTED FIGURE ANNOTATIONS (NOT GRAPHS) FOR NUMERICAL REFERENCE SIGNS

FIG. 1
100 single photon source
102 nanowire
104 photon emitter
106 intrinsic region of nanowire
108 p-type zone of nanowire
110 n-type zone of nanowire
112 first ITO layer
114 second ITO layer
116 a bottom metallic layer
118 substrate
120 contact pad
122 planarizer
 FIG. 3
102 (end of) nanowire
114 second ITO layer
116 a bottom metallic layer
122 planarizer
330 direction of photon inside nanowire, travelling towards second end
332 direction of photon inside nanowire, travelling towards first end
 FIG. 5
102 (end of) nanowire
532 direction of photon inside nanowire, travelling towards first end
534 direction of photon travelling outside nanowire
536 lens
 FIG. 8
802 (end of) nanowire
822 planarizer
832 direction of photon inside nanowire, travelling towards first end
 FIG. 11
1100 single photon source
1102 nanowire
1104 photon emitter
1106 intrinsic zone of nanowire
1108 p-type zone of nanowire 1110 n-type zone of nanowire
1112 first ITO layer
1114 second ITO layer
1116 a bottom metallic layer
1118 substrate
1120 first contact pad
1121 second contact pad
1122 planarizer
1124 distributed Bragg reflector
  FIG. 12
1200 single photon source
1202 nanowire
1204 photon emitter
1206 intrinsic zone of nanowire
1208 p-type zone of nanowire
1210 n-type zone of nanowire
1212 first ITO layer
1214 second ITO layer
1216 a bottom metallic layer
1218 substrate
1220 contact pad
1222 planarizer
  FIG. 13
1202 (end of) nanowire
1212 1st ITO layer
1222 planarizer
1332 direction of photon inside nanowire, travelling towards first end
  FIG. 15
1500 single photon source
1502 nanowire
1504 photon emitter
1506 intrinsic zone of nanowire
1508 p-type zone of nanowire
1510 n-type zone of nanowire
1512 first ITO layer
1514 second ITO layer
1516 a bottom metallic layer
1518 substrate
1520 contact pad
1522 planarizer
  FIG. 16
1502 (end of) nanowire
1512 first ITO layer
1522 planarizer
1632 direction of photon inside nanowire, travelling towards first end
1634 direction of photon travelling outside nanowire
1636 lens
  FIG. 18
1800 single photon source
1802 nanowire
1804 photon emitter
1806 intrinsic zone of nanowire
1808 p-type zone of nanowire
1810 n-type zone of nanowire
1812 first ITO layer
1814 second ITO layer
1816 a bottom metallic layer
1818 substrate
1820 contact pad
1822 planarizer
1823 air
1826 transparent layer
1828 annular metallic electrode
  FIG. 19
1802 (end of) nanowire
1826 transparent layer, anti-reflection coating
1828 annular metallic electrode
1932 direction of photon inside nanowire, travelling towards first end
1934 direction of photon travelling outside nanowire
1936 lens
  FIG. 22
2204 photon emitter
2218 substrate
2224 distributed Bragg reflector (dBr)
  FIG. 23
2302 nanowire
2304 photon emitter
2314 second ITO layer
2316 a bottom metallic layer
2318 substrate
2323 air
2326 transparent layer
2328 annular metallic electrode
2332 direction of photon inside nanowire travelling towards first end
2334 direction of photon travelling outside nanowire
2338 grooves
2340 surface plasmons travelling along surface of annular metallic electrode
2342 photons emitted from surface of annular metallic electrode
  FIG. 24
2402 nanowire
2426 transparent layer
2428 annular metallic electrode
2432 direction of photon inside nanowire travelling towards first end
2434 direction of photon travelling outside nanowire
2439 metallic strips
2440 surface plasmons travelling along surface of annular metallic electrode
2442 photons emitted from surface of annular metallic electrode
  FIG. 25
2526 transparent layer
2528 annular metallic electrode
2538 grooves
  FIG. 29
2923 air
2936 lens
2944 polymer

The invention claimed is:

1. A single photon source comprising:
a nanowire made of a semiconductor material comprising a p-type zone and an n-type zone, the nanowire having a first end and a second end,
a first electrode, the first electrode being electrically coupled to a photon emitter, and
a second electrode, the second electrode being electrically coupled to the photon emitter,
an optical element arranged proximate the second end configured to reflect a photon travelling inside the nanowire towards the first end of the nanowire, the photon being emitted from the first end of the nanowire;
wherein the photon emitter is located inside the nanowire, wherein the photon emitter is enclosed within the nanowire, and wherein the single photon source is configured to emit a single photon only from the first end of the nanowire when an activation voltage is applied between the first electrode and the second electrode, and wherein a first portion of the nanowire has a diameter which increases toward the first end of the nanowire, the first portion being disposed between the photon emitter and the first end.

2. The single photon source according to claim 1, wherein the nanowire is of a first material, with a first refractive index (n_nw) and the nanowire is encircled by a first optical medium with a second refractive index (n_om1), wherein the first refractive index is larger than the second refractive index.

3. The single photon source according to claim 1, wherein an effective diameter (D_nw) of the nanowire at a portion along a length axis of the nanowire, the said portion comprising the position of the photon emitter, is arranged to suppress a rate (G_Rad) of spontaneous emission (SE) to radiation modes.

4. The single photon source according to claim 1, wherein the nanowire has an effective diameter (D_nw) at a portion along a length axis of the nanowire, the said portion comprising the position of the photon emitter, and the nanowire is of a first material with first refractive index (n_nw) wherein the effective diameter (D_nw) of the nanowire at a portion along a length axis of the nanowire, the said portion comprising the position of the photon emitter, is within the range $$\lambda/(3 \cdot n\_nw) < D\_nw < 2 \cdot \lambda/n\_nw,$$

wherein n_nw is the first refractive index of the first material of the nanowire, and lambda is the wavelength of the emitted photon in free space.

5. The single photon source according to claim 1, further comprising a first optical element, the first optical element being a material arranged to reduce the reflection back into the nanowire of a photon travelling inside the nanowire in a direction towards the first end.

6. The single photon source according to claim 5, wherein the first optical element is an electrically conducting material.

7. The single photon source according to claim 1, wherein the optical element comprises an electrically conducting material.

8. The single photon source according to claim 1, wherein the optical element comprises:
   a reflective surface, a surface of the second end of the nanowire, and
   an interfacial second optical medium located between the reflective surface and the surface of the second end of the nanowire, wherein the second optical medium is transparent and electrically conducting.

9. The single photon source according to claim 1, wherein the first end of the nanowire is substantially planar.

10. The single photon source according to claim 1, wherein the photon emitter is capable of emitting a single photon at a specific wavelength.

11. The single photon source according to claim 1, the single photon source further comprising a spectral filter.

12. The single photon source according to claim 1, wherein the nanowire comprises GaAs and the photon emitter comprises InAs or InGaAs and/or wherein the nanowire comprises InP and the photon emitter comprises InAs or InAsP.

13. The single photon source according to claim 1, wherein the photon emitter is selected from the group consisting of a quantum dot and an isolated impurity atom in a semiconductor material.

14. The single photon source according to claim 1, wherein the nanowire comprises diamond and the photon emitter is a colour centre.

15. The single photon source according to claim 1, wherein the single photon is emitted with a wavelength, in free space, within the telecom ranges.

16. The single photon source according to claim 2, wherein the first optical medium comprises a gas.

17. A method of generating a single photon comprising applying an activation voltage between a first electrode and a second electrode in the single photon source of claim 1.

18. A device for optical communication comprising the single photon source of claim 1.

* * * * *

UNITED STATES PATENT AND TRADEMARK OFFICE
CERTIFICATE OF CORRECTION

PATENT NO. : 9,112,082 B2  
APPLICATION NO. : 13/384411  
DATED : August 18, 2015  
INVENTOR(S) : Niels Gregersen Page 1 of 1

It is certified that error appears in the above-identified patent and that said Letters Patent is hereby corrected as shown below:

Title page

On page 1, Item 75, line 2, Change "Gendoble Cedex (FR);" for Julien Claudon to --Grenoble Cedex 9 (FR);--

Specification

In column 2, line 16, Change "Nanwire" to --Nanowire--

In column 2, line 46, Change "material" to --material,--

In column 11, line 36, Change "D_l" to --D_sl--

In column 11, line 37, Change "n_l" to --n_sl--

In column 11, line 55, Change "Schroedinger" to --Schrodinger--

In column 21, line 24, Change "micrometer," to --micrometer.--

In column 26, line 47, Change "polymer" to --polymer.--

Signed and Sealed this  
Fifth Day of July, 2016

Michelle K. Lee  
*Director of the United States Patent and Trademark Office*